(12) United States Patent
Teshirogi et al.

(10) Patent No.: US 7,571,538 B2
(45) Date of Patent: Aug. 11, 2009

(54) VACUUM FIXING JIG FOR SEMICONDUCTOR DEVICE

(75) Inventors: Kazuo Teshirogi, Kawasaki (JP); Yuzo Shimobeppu, Kawasaki (JP); Kazuhiro Yoshimoto, Kawasaki (JP); Mitsuhisa Watanabe, Kawasaki (JP); Yoshiaki Shinjo, Kawasaki (JP); Eiji Yoshida, Kawasaki (JP); Noboru Hayasaka, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/075,712

(22) Filed: Mar. 10, 2005

(65) Prior Publication Data
US 2005/0221587 A1   Oct. 6, 2005

Related U.S. Application Data

(62) Division of application No. 10/708,067, filed on Feb. 6, 2004, now Pat. No. 6,902,944, which is a division of application No. 10/101,169, filed on Mar. 20, 2002, now Pat. No. 6,750,074.

(30) Foreign Application Priority Data

Oct. 19, 2001   (JP) ............................. 2001-322811

(51) Int. Cl.
*B23P 19/00* (2006.01)
*H01L 21/10* (2006.01)

(52) U.S. Cl. .............................. 29/729; 29/743; 438/33; 269/21

(58) Field of Classification Search .................. 29/729, 29/739–743, 760, 414; 438/106–110, 33, 438/68; 257/678–680; 451/6, 13; 269/20–21, 269/67

See application file for complete search history.

(56) References Cited

U.S. PATENT DOCUMENTS

| | | | |
|---|---|---|---|
| 4,016,829 A | | 4/1977 | Ito et al. ........................ 118/64 |
| 4,739,545 A | * | 4/1988 | Oyanagi ......................... 29/57 |
| 4,921,564 A | * | 5/1990 | Moore .......................... 156/344 |
| 5,133,824 A | * | 7/1992 | Huberts et al. ............... 156/344 |
| 5,238,876 A | | 8/1993 | Takeuchi et al. |

(Continued)

FOREIGN PATENT DOCUMENTS

CN   1261568 A   8/2000

(Continued)

OTHER PUBLICATIONS

Extended European Search Report mailed Mar. 25, 2009 (6 pages).

(Continued)

*Primary Examiner*—Minh Trinh
(74) *Attorney, Agent, or Firm*—Kratz, Quintos & Hanson, LLP

(57) ABSTRACT

The present invention relates to a Jig and method of manufacturing a semiconductor substrate including the back grind step, the dicing step, the pick up step, and the die bonding step of the wafer; and to a semiconductor substrate jig used in such method. The object of the present invention is to mitigate the effect and to prevent damage caused by the lack of strength in thinned semiconductor substrates. A jig with an outer frame 21, and a rubber film 22 arranged within the outer frame 21 and having increasing and decreasing body size while deforming its shape by supplying air therein are provided. As the volume of the rubber film 22 increases, the wafer-fixing jig 20 deforms the rubber film and allows the tapes 2 and 6 arranged between the wafer 1 and the rubber film 22A to be pushed toward the wafer 1 gradually from the center outward. The attachment step, the back grind step, the tape reapplication step, the pick up step and the die bonding step are conducted using such wafer-fixing jig.

1 Claim, 17 Drawing Sheets

U.S. PATENT DOCUMENTS

| | | | |
|---|---|---|---|
| 5,288,663 A | 2/1994 | Ueki | 438/460 |
| 5,300,175 A * | 4/1994 | Gardner et al. | 156/285 |
| 5,447,596 A * | 9/1995 | Hayase | 156/584 |
| 5,458,755 A | 10/1995 | Fujiyama et al. | 204/224 R |
| 5,534,102 A * | 7/1996 | Kadono et al. | 156/250 |
| 5,593,532 A | 1/1997 | Falk et al. | |
| 5,631,191 A | 5/1997 | Durand et al. | 438/119 |
| 5,930,654 A | 7/1999 | Tohyama et al. | 438/464 |
| 5,938,512 A | 8/1999 | Takei et al. | 451/388 |
| 6,037,026 A | 3/2000 | Iwamoto | 428/40 |
| 6,176,966 B1 * | 1/2001 | Tsujimoto et al. | 156/344 |
| 6,297,131 B1 | 10/2001 | Yamada et al. | |
| 6,337,258 B1 | 1/2002 | Nakayoshi et al. | |
| 6,346,433 B1 * | 2/2002 | Maeda et al. | 438/108 |
| 6,382,609 B1 | 5/2002 | Namioka et al. | 269/21 |
| 6,391,679 B1 | 5/2002 | Anker et al. | |
| 6,413,873 B1 | 7/2002 | Li et al. | 438/711 |
| 6,451,671 B1 | 9/2002 | Yamada | |
| 6,481,482 B1 | 11/2002 | Shimotomai | 156/366 |
| 6,503,131 B1 * | 1/2003 | Franklin et al. | 451/296 |
| 6,596,561 B2 * | 7/2003 | Takahashi et al. | 438/113 |
| 6,627,037 B1 | 9/2003 | Kurokawa et al. | 156/344 |
| 2001/0024936 A1 | 9/2001 | Ishikawa et al. | 451/67 |

FOREIGN PATENT DOCUMENTS

| | | | | |
|---|---|---|---|---|
| EP | 0 850 723 | | 7/1998 | |
| EP | 0 866 494 | | 9/1998 | |
| EP | 0 999 583 | | 5/2000 | |
| EP | 1 107 299 A2 | | 6/2001 | |
| EP | 1 304 728 | | 4/2003 | |
| JP | 61172337 A | * | 8/1986 | |
| JP | 2-53558 | * | 2/1990 | |
| JP | 5-38649 | * | 2/1993 | |
| JP | 08-078508 | | 3/1996 | |
| JP | 10-233430 | | 9/1998 | |
| JP | 11-307488 | | 11/1999 | |
| JP | 2000-101117 | | 4/2000 | |
| JP | 2000-208446 | | 7/2000 | |
| JP | 2000-216115 | | 8/2000 | |
| JP | 2000-306875 | | 11/2000 | |
| JP | 2000-323440 | | 11/2000 | |
| JP | 2000-357711 | | 12/2000 | |
| JP | 2001-035817 | | 2/2001 | |
| JP | 2001-144139 A | * | 5/2001 | |
| KR | 10-0217889 | | 6/1999 | |
| KR | 2001-0049554 | | 6/1999 | |
| KR | 2000-0077146 | | 12/2000 | |
| KR | 2001-0049554 | | 6/2001 | |

OTHER PUBLICATIONS

Korean Office Action mailed Mar. 18, 2009 with English translation (8 pages).
Korean Office Action mailed Nov. 27, 2007 (4 pages).
Extended European Search Report mailed Apr. 8, 2009 (6 pages).
Extended European Search Report mailed May 6, 2009 (4 pages).
Extended European Search Report mailed Apr. 8, 2009 (6 pages).
Extended European Search Report mailed May 6, 2009 (4 pages).

* cited by examiner

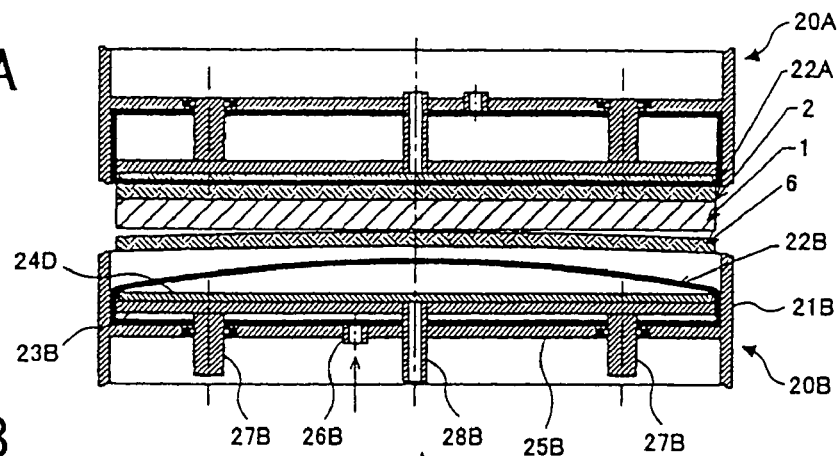
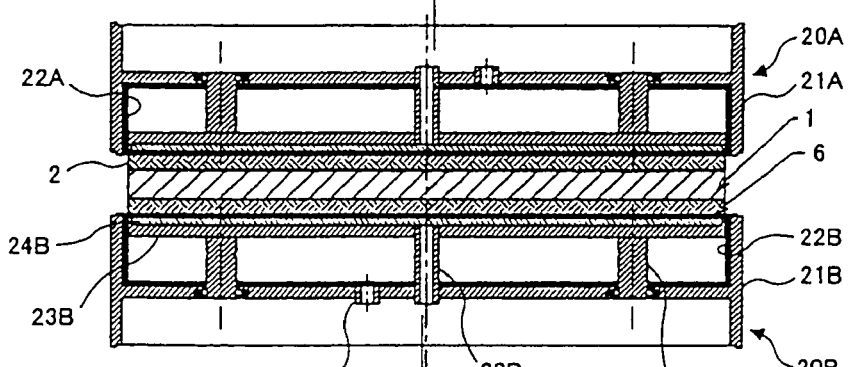
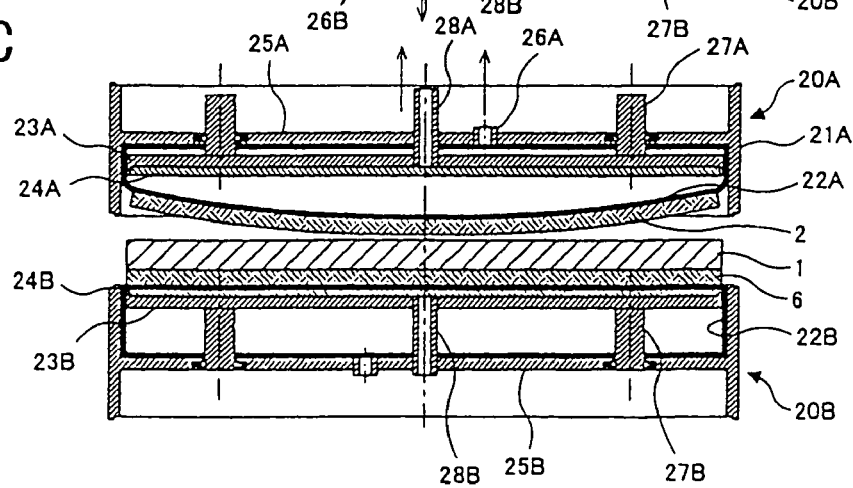

TURNING OVER

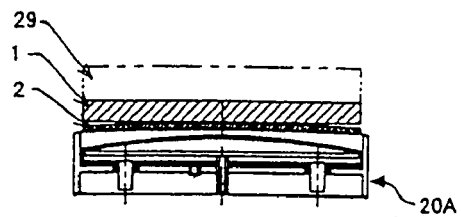
FIG. 7A
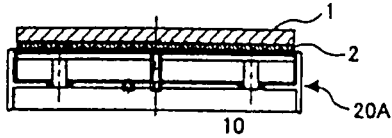
FIG. 7B
FIG. 7C
TURNING OVER
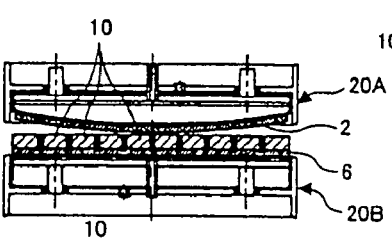
FIG. 7D
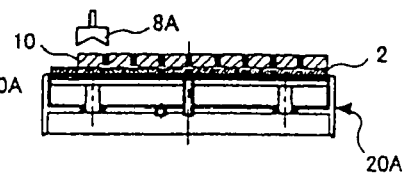
FIG. 7H
FIG. 7I
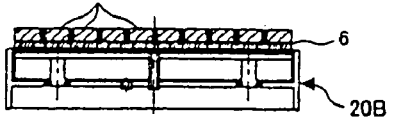
FIG. 7E
TURNING OVER
FIG. 7F
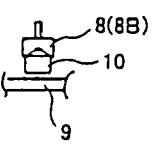
FIG. 7G

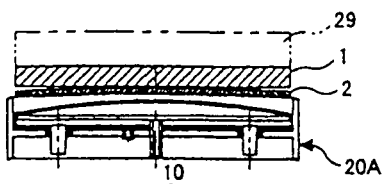
FIG. 8A
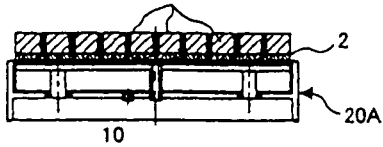
FIG. 8B
FIG. 8C
FIG. 8H
TURNING OVER
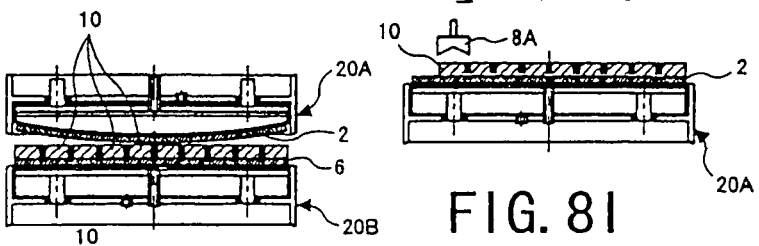
FIG. 8D
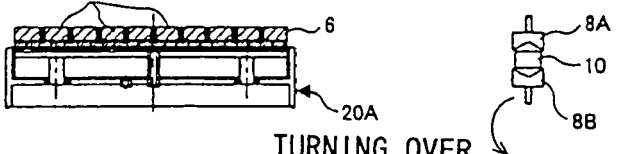
FIG. 8E
FIG. 8I
TURNING OVER
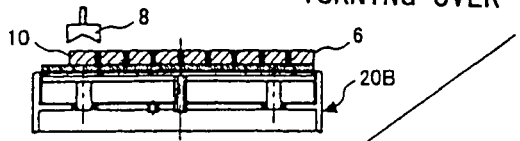
FIG. 8F
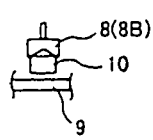
FIG. 8G

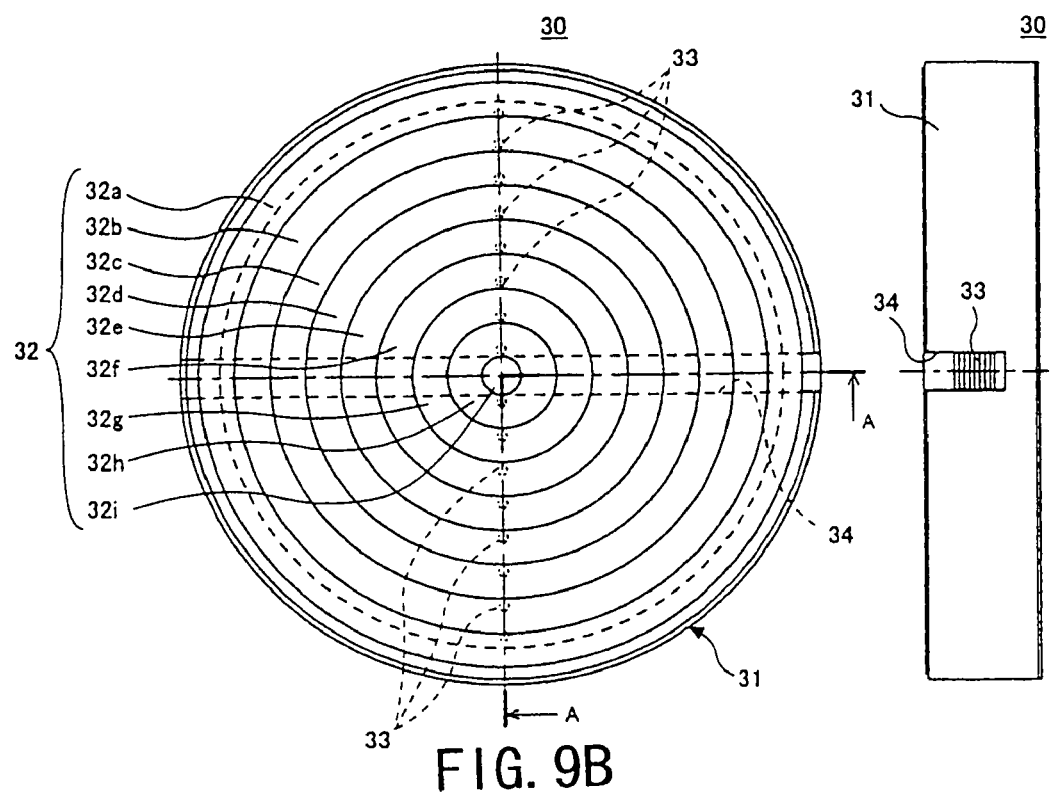

TURNING OVER

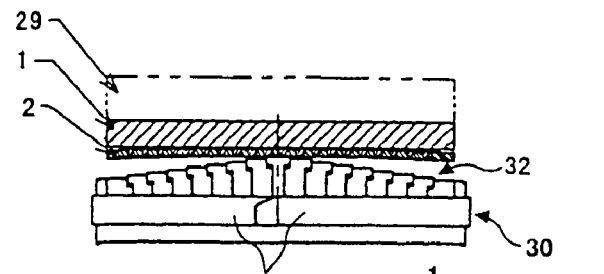
FIG. 12A
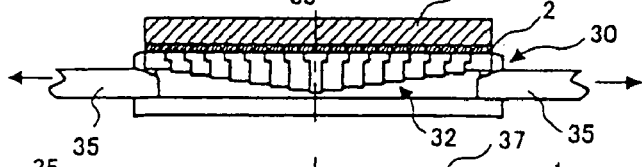
FIG. 12B
FIG. 12C
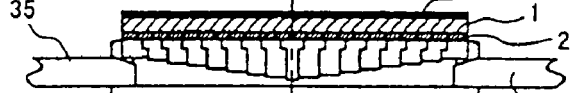
TURNING OVER
FIG. 12D
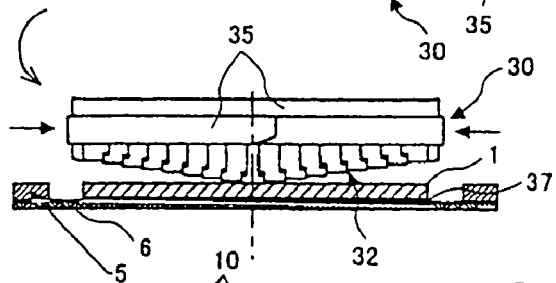
FIG. 12E
FIG. 12F
FIG. 12G
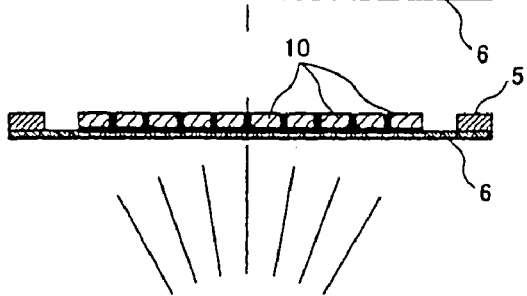
FIG. 12H
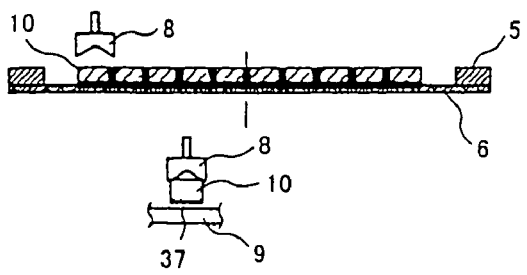

TURNING OVER

TURNING OVER

VACUUM FIXING JIG FOR SEMICONDUCTOR DEVICE

CROSS REFERENCE TO RELATED APPLICATION

This application is a divisional application of U.S. Ser. No. 10/708,067, filed on Feb. 6, 2004 now U.S. Pat. No. 6,902,944 (which is a divisional application of U.S. Ser. No. 10/101,169, filed on Mar. 20, 2002 now U.S. Pat. No. 6,750,074), the entire contents of which are incorporated herein by reference.

BACKGROUND OF THE INVENTION

This application claims the benefit of a Japanese Patent Application No. 2001-322811 filed Oct. 19, 2001 in the Japanese Patent Office, the disclosure of which is hereby incorporated by reference.

1. Field of the Invention

The present invention generally relates to jigs for semiconductor substrates and methods for manufacturing semiconductor devices using the same, and more particularly to a method of manufacturing a semiconductor device including a step of back grinding the back surface of the semiconductor substrate (wafer), a step of dicing for singularizing into semiconductor elements, and a step of bonding including picking up such singularized semiconductor elements and mounting them to the mounting device; as well as to a jig for semiconductor devices used for such a method.

Recently, with the necessity for semiconductor packages to be light, thin, short and small, the related wafers are also becoming thinner.

In each step such as in the back grind step, when the thickness of the wafer is less than 100 .mu.m, the wafer transportation and the semiconductor manufacturing process are technically very difficult using conventional methods. For this reason, a method of securely transporting and performing the process of semiconductor manufacturing with thinner wafers is desired.

2. Description of the Related Art

Conventionally, in manufacturing steps consisting of back grinding the semiconductor substrate (hereinafter also referred to as the wafer), singularizing the wafer into semiconductor elements by dicing, and bonding the singularized semiconductor elements on, for example, the mounting substrate, the transportation and the predetermined processes are carried out with the wafer attached to a tape. Each manufacturing step is described with reference to FIG. 1.

First, as shown in FIG. 1A, a circuit-forming surface is attached to a protection tape 2 (attachment step). Subsequently, as shown in FIG. 1B, the wafer 1 is installed to a chuck table 4 and the back surface of the wafer 1 is back grounded by a rotating grind whetstone 3 (back grind step). As a result, the wafer 1 is thinned.

Secondly, a die attach film (not shown) is attached to the back surface of the thinned wafer 1 (die attach mount step).

Subsequently, as shown in FIG. 1C, as the protection tape 2 attached to the wafer 1 is peeled, the back surface of the wafer 1 is attached to a dicing tape 6 (tape reapplication step). The dicing tape 6 is previously arranged in a frame 5 having a shape of a frame.

Next, as shown in FIG. 1D, the wafer 1 is cut along the predetermined dicing line using a dicing saw 7, and the wafer is singularized into semiconductor elements 10 (singularization step).

The singularized semiconductor elements 10 are pressed on their back surfaces through the dicing tape 6 using a push up pin 11 and as a result, the semiconductor elements 10 are peeled from the dicing tape 6, as shown in FIG. 1E. A collet 8 is located opposite the push up pin 11 on the upper side, and the peeled semiconductor elements 10 are adsorbed to and held by the collet 8 (pick up step).

The semiconductor elements 10 held by the collet 8 are transferred to the mounting substrate 9 as the collet 8 moves, and are bonded to the predetermined position on the mounting substrate 9 by the die attach film (bonding step). Through these steps, the semiconductor elements 10 formed on the wafer 1 are thinned and singularized, and then mounted on the mounting substrate 9.

The wafer 1 made extremely thin by the back grind step warps, which was not a problem with a conventional thickness. The thinning of the wafer 1 is not only the direct cause of reduction in the absolute strength of the wafer. When the wafer 1 warps, the performance of each manufacturing step after the back grind step is degraded, and along with transportation of the wafer becomes a factor of breakage failure.

This is significant particularly in the tape reapplication step. In other words, during the tape application, bubbles are likely to enter between the wafer 1 and the dicing tape 6 if the wafer 1 is thin.

When bubbles enter, the wafer 1 and the dicing tape 6 do not adhere at the locations where bubbles exist, and thus the adhesive strength between the wafer 1 and the dicing tape 6 decreases. Furthermore, when heat is applied, the bubbles expand and the wafer 1 and the dicing tape 6 are further separated from each other. Therefore, when bubbles enter, there is a possibility that an appropriate process may not be successfully performed in the steps subsequently conducted (for example, the singularization step), and the yield of the semiconductor manufacturing process is lowered, and in the worst case, the wafer 1 may break due to the expansion of bubbles.

On the other hand, in considering peeling the protection tape, the wafer 1 may break when the protection tape 2 is being peeled, or the wafer 1 may be peeled from the periphery at the start of peeling, and then break.

SUMMARY OF THE INVENTION

In view of the above problems, the general object of the present invention is to provide a jig for holding the semiconductor substrate so that there is little effect from thinned semiconductor substrates, and for suppressing the occurrence of damage caused by lack of semiconductor substrate strength; and to provide a method of manufacturing a semiconductor device using the jig.

The above object of the present invention is achieved by the following measures of the present invention.

The object of the present invention is achieved by a method of manufacturing a semiconductor device using a semiconductor substrate jig, wherein a method comprises the steps of fixing a semiconductor substrate flatly to a semiconductor substrate jig so as to prevent warps from occurring in the semiconductor substrate; and dicing the semiconductor substrate into a plurality of semiconductor elements while fixed to the semiconductor substrate jig.

According to this invention, since the semiconductor substrate is fixed to the semiconductor substrate jig without warps, the dicing step of the semiconductor substrate can be carried out smoothly.

The object of the present invention is further achieved by a method of manufacturing a semiconductor device using a semiconductor substrate jig comprising the steps of fixing a semiconductor substrate flatly to the semiconductor substrate jig so as to prevent warps from occurring in the semiconductor substrate; and back grinding the semiconductor substrate while attached to the semiconductor substrate jig.

According to this invention, since the semiconductor substrate is fixed to the semiconductor substrate jig without warps, the back grind step of the semiconductor substrate can be carried out smoothly.

The object of the present invention is achieved by a semiconductor substrate jig used for arranging a film on a semiconductor substrate, wherein the jig has a frame, an expandable member arranged within the frame and increasing or decreasing volume while deforming a shape by being supplied with fluid therein; and the shape is deformed so that the film arranged between the semiconductor substrate and the expandable member presses against the semiconductor substrate as contacting portion of the expandable member to the film is enlarged outwardly from the center of the film as the volume increases.

According to the present invention, when the volume of the expandable member increases, the film arranged between the semiconductor substrate and the expandable member deforms so as to be gradually pushed toward the semiconductor substrate from the center outward, and thus the air (bubbles) between the semiconductor substrate and the film is pushed outward from by the center outward as the expandable member deforms.

Therefore, the bubbles are prevented from remaining between the semiconductor substrate and the film, and the subsequent manufacturing steps are conducted smoothly and thus the breakage failure of the semiconductor substrate caused by the bubbles is prevented.

The above object of the present invention is also achieved by a method of manufacturing a semiconductor device using a semiconductor substrate jig described above, wherein the method has steps of:

attaching a circuit-forming surface of the semiconductor substrate to the semiconductor substrate jig using a first adhesive tape as the film;

back grinding a back surface of the semiconductor substrate while attached to the semiconductor substrate jig;

reapplying and fixing the semiconductor substrate to a second semiconductor substrate jig so as to expose the circuit-forming surface;

singularizing the semiconductor substrate fixed on the second semiconductor substrate jig into a plurality of semiconductor elements by dicing; and picking up each of the singularized semiconductor elements from the second semiconductor substrate jig.

According to the above method of the present invention, since the semiconductor substrate jig is used, the bubbles are prevented from remaining between the semiconductor substrate and the first adhesive tape, and the semiconductor substrate is securely held to the semiconductor substrate jig in the back grind step. Thus, the back grind step is conducted smoothly.

The object of the present invention is further achieved by a method of manufacturing a semiconductor device using a semiconductor substrate jig, wherein the method comprises the steps of:

attaching a circuit-forming surface of the semiconductor substrate to the semiconductor substrate jig using a first adhesive tape as the film;

back grinding a back surface of the semiconductor substrate while attached to the semiconductor substrate jig;

singularizing the back grounded semiconductor substrate fixed on the semiconductor substrate jig into a plurality of semiconductor elements by dicing;

reapplying and fixing all of the semiconductor elements on a second semiconductor substrate jig so as to collectively expose the circuit-forming surface; and picking up each of the singularized semiconductor substrates from the second semiconductor substrate jig.

As described above, after the back grind step is completed, the tape reapplication step may be conducted before or after performing the singularization step.

The object of the present invention is furthermore achieved by a method of manufacturing a semiconductor device using a semiconductor substrate jig described above, wherein the method comprises the steps of:

attaching a circuit-forming surface of the semiconductor substrate to the semiconductor substrate jig using a first adhesive tape as the film;

back grinding a back surface of the semiconductor substrate while attached to the semiconductor substrate jig;

singularizing the back grounded semiconductor substrate fixed to a second semiconductor substrate jig into a plurality of semiconductor elements by dicing; and picking up each of the singularized semiconductor elements from the second semiconductor substrate jig and turning the picked up semiconductor elements upside down.

According to the above method of the present invention, since the tape reapplication step does not exist, the damage to the semiconductor substrate is prevented and there is no possibility of bubbles entering between the semiconductor substrate and the adhesive tape at the time of reapplication.

The object of the present invention is also achieved by a method of manufacturing a semiconductor device using a semiconductor substrate jig described above, wherein the method comprises the steps of:

attaching a circuit-forming surface of the semiconductor substrate to the semiconductor substrate jig using a first adhesive tape as the film;

singularizing the semiconductor substrate fixed on the semiconductor substrate jig into a plurality of semiconductor elements by dicing;

back grinding collectively back surfaces of plural semiconductor element attached to the semiconductor substrate jig;

reapplying and fixing the semiconductor elements collectively to a second semiconductor substrate jig so as to expose the circuit-forming surface; and picking up each of the semiconductor elements from the second semiconductor substrate jig.

The object of the present invention is achieved by a method of manufacturing a semiconductor device using a semiconductor substrate jig described above, wherein the method comprises the steps of:

attaching a circuit-forming surface of the semiconductor substrate to the semiconductor substrate jig using a first adhesive tape as the film;

singularizing the semiconductor substrate fixed on the semiconductor substrate jig into a plurality of semiconductor elements by dicing;

back grinding back surfaces of plural singularized semiconductor elements attached to the semiconductor substrate jig; and picking up each of the singularized semiconductor elements from the second semiconductor substrate jig and turning the picked up semiconductor elements upside down.

When the above method is used, by conducting the back grind step after the singularization step is completed, the strength of the semiconductor element is increased. Further, because the reapplication step is excluded, the damage to the semiconductor element and the entering of bubbles between the semiconductor element and the adhesive tape are prevented.

The object of the present invention is achieved by a semiconductor substrate jig used for arranging a film on a semiconductor substrate, wherein the jig comprises:

a frame with a bottom;

a set of plural annular members arranged concentrically within the frame and constructed so as to be individually movable in a direction perpendicular to the semiconductor substrate, the height of the annular members in the direction perpendicular to the semiconductor substrate gradually increasing from an outer circumference toward an inner circumference;

a biasing member for biasing each of the annular members toward the bottom of the frame; and an operating member contacting the annular members by operating movement in the frame and provided for biasing in a direction separating the annular members from the bottom of the frame against the bias force of the biasing member; wherein each of the annular members moves so as to gradually presses the film arranged between the semiconductor substrate and the set of annular member toward the semiconductor substrate from center outward with the operation of the operating member.

According to the above method of the present invention, with the operation of the operating member, each annular member is independently moved and gradually presses the film toward the semiconductor substrate from the center outward. Thus, the air (bubbles) between the semiconductor substrate and the film is pushed from the center outward with the movement of the annular member.

Therefore, the bubbles are prevented from existing between the semiconductor substrate and the film, and the subsequent manufacturing steps are smoothly conducted and the damage to the semiconductor substrate caused by the entering of the bubbles is prevented.

The object of the present invention is achieved by a method of manufacturing a semiconductor device using a semiconductor substrate jig, wherein the method comprises the steps of:

attaching a circuit-forming surface of the semiconductor substrate to the semiconductor substrate jig using a first adhesive tape as the film;

back grinding a back surface of the semiconductor substrate while attached to the semiconductor substrate jig;

die attach mounting for arranging die attach material to the back surface of the semiconductor substrate;

reapplying and fixing the semiconductor substrate on a second semiconductor substrate jig and exposing the circuit-forming surface;

singularizing the semiconductor substrate fixed on the second semiconductor substrate jig into a plurality of semiconductor elements by dicing; and picking up each of the singularized semiconductor elements from the second semiconductor substrate jig.

According to the above method of the present invention, the entering of bubbles between the semiconductor substrate and the first adhesive tape is prevented, and the semiconductor substrate is securely held by the semiconductor substrate jig in the back grind step. Thus, the back grind step is conducted smoothly.

The object of the present invention is achieved by semiconductor substrate jig used in arranging a film to a semiconductor substrate, wherein the jig comprises:

a frame;

a porous member arranged within the frame so as to be opposite the film; and a vacuum hole formed in the frame and provided for applying negative pressure to the porous member.

With the above semiconductor substrate jig, it is possible to prevent bubbles from entering between the film and the semiconductor substrate because the film is adsorbed to the semiconductor substrate jig through the negative pressure applied to the porous member and thus the film is planed.

The object of the present invention is achieved by a method of manufacturing a semiconductor substrate comprising the steps of:

attaching a circuit-forming surface of the semiconductor substrate to a semiconductor substrate jig that transmits light using a double-sided tape applied with an adhesive having ultraviolet curing properties on both sides;

back grinding a back surface of the semiconductor substrate attached to the semiconductor substrate jig;

irradiating ultraviolet rays to adhesives having the ultraviolet curing properties through the semiconductor substrate;

reapplying for arranging die attach film to the back surface of the semiconductor substrate, reapplying and fixing the semiconductor substrate to a second semiconductor substrate jig, and then exposing the circuit-forming surface;

singularizing the semiconductor substrate fixed on the second semiconductor substrate jig into a plurality of semiconductor elements by dicing; and picking up each of the singularized semiconductor elements from the second semiconductor substrate jig.

According to the above method of the present invention, as the material that transmits light is selected to be used as the semiconductor substrate jig, ultraviolet rays can be irradiated to the adhesives with the properties of ultraviolet curing through the semiconductor substrate jig in the tape reapplication step even if the back grind step is conducted with the semiconductor substrate adhering to the semiconductor substrate jig.

The object of the present invention is achieved by a semiconductor substrate jig comprising:

a first jig having a first suction mechanism sucking the semiconductor substrate; and a second jig having a second suction mechanism sucking the semiconductor substrate;

the first and second jigs being removably constructed and independently sucking the semiconductor substrate.

According to the above jig of the present invention, because the first and the second suction mechanisms can independently suck the semiconductor substrate, the semiconductor substrate can be mounted independently to the first or the second jig. Thus, when the first jig and the second jig are combined, the semiconductor substrate can be suctioned using the first suction mechanism and the second suction mechanism.

Therefore, in case suction is switched from the first suction mechanism to the second suction mechanism, the suction of the second suction mechanism starts while the first suctioning mechanism is still suctioning, and then the suction by the first suction mechanism is released, thus the semiconductor substrate is constantly suctioned. The semiconductor substrate is prevented from warping because the semiconductor substrate is held either by the first or the second jig even if the semiconductor substrate is thinned.

BRIEF DESCRIPTION OF THE DRAWINGS

The description of the preferred embodiments of the present invention will now be explained with reference to the figures in which:

FIGS. 5A-5C are flow diagrams explaining in detail steps of attaching a wafer to the jig;

FIGS. 7A-7I are flow diagrams explaining in detail the method of manufacturing a semiconductor device according to a third embodiment of the present invention;

FIGS. 8A-8I are flow diagrams explaining in detail the method of manufacturing a semiconductor device according to a fourth embodiment of the present invention;

FIG. 9A is a top view showing a semiconductor substrate jig according to the second embodiment of the present invention;

FIG. 9B is a cross sectional view showing the semiconductor substrate jig according to the second embodiment of the present invention;

FIG. 9C is a right side view showing the semiconductor substrate jig according to the second embodiment of the present invention;

FIGS. 12A-12H are flow diagrams explaining in detail the method of manufacturing a semiconductor device according to a sixth embodiment of the present invention;

DESCRIPTION OF THE PREFERRED EMBODIMENTS

Figure 1A:
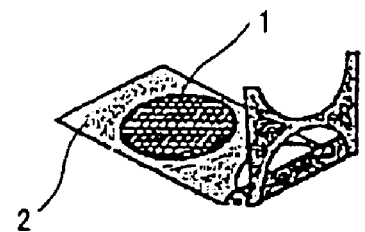
FIGS. 1A-1E are flow diagrams for explaining conventional method of manufacturing a semiconductor device.
Figure 1B:
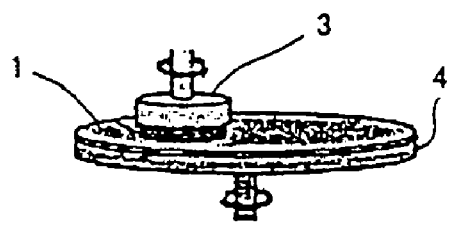
Figure 1C:
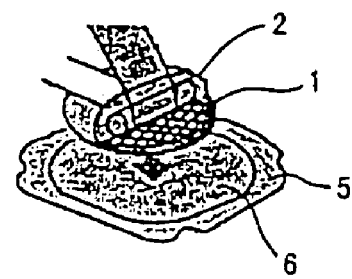
Figure 1D:
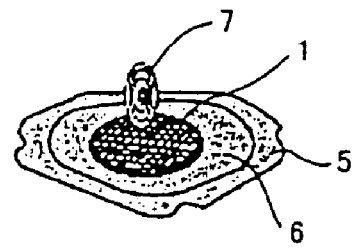
Figure 1E:
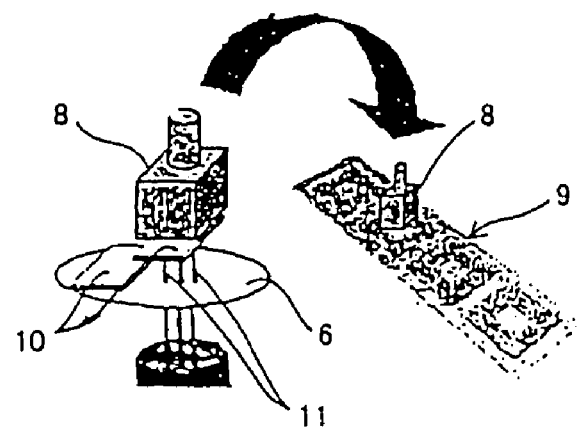
Figure 2A:
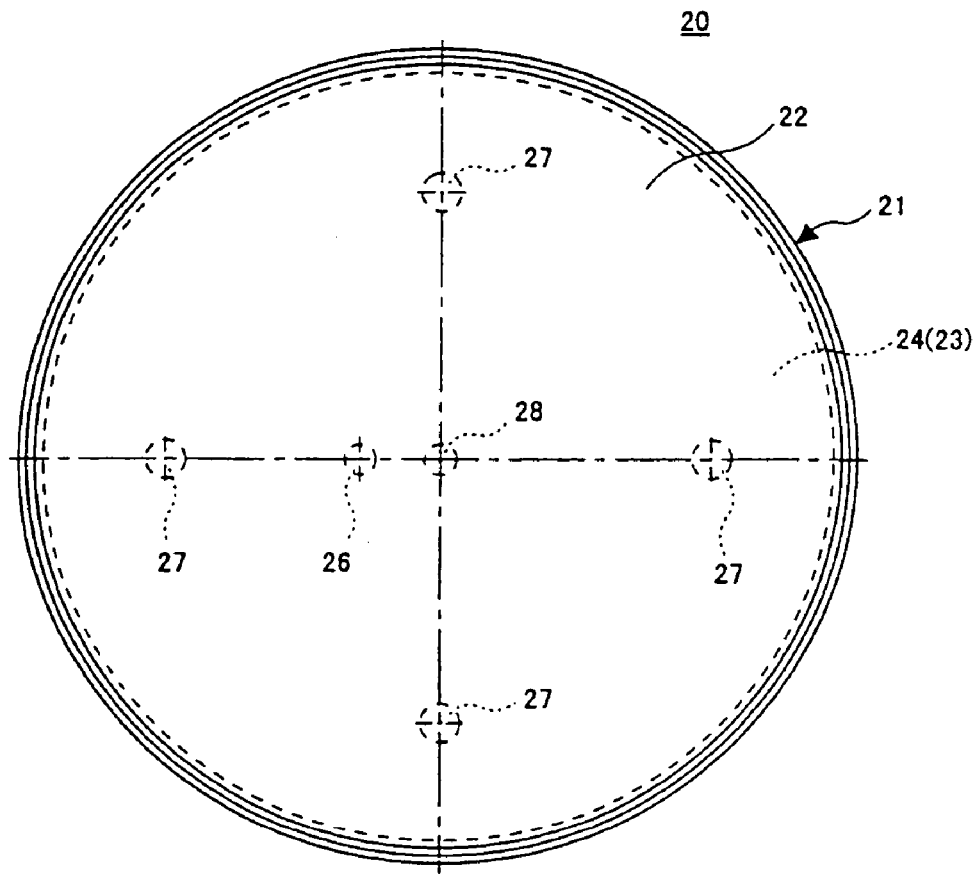
FIG. 2A is a top view showing a semiconductor substrate jig according to a first embodiment of the present invention.
Figure 2B:
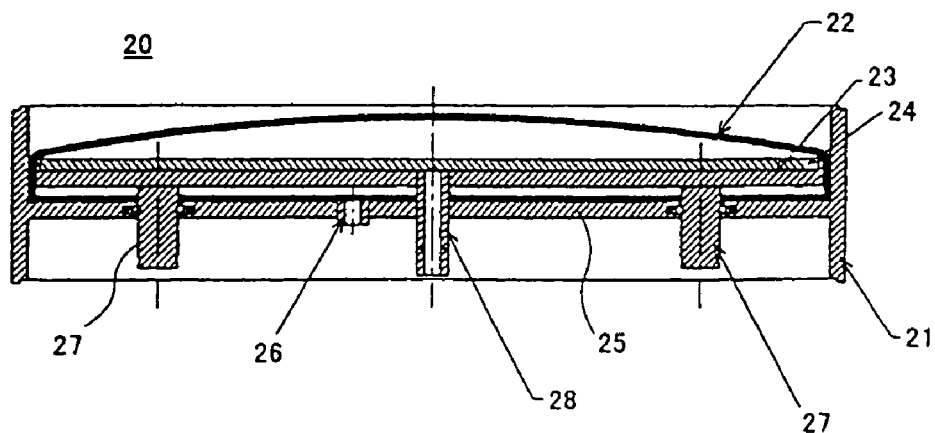
FIG. 2B is a cross sectional view showing the semiconductor substrate jig according to a first embodiment of the present invention.

FIG. 2 shows a wafer-fixing jig 20 according to a first embodiment of the present invention. FIG. 2A is a top view of the wafer-fixing jig 20, and FIG. 2B is a cross sectional view of the wafer-fixing jig 20. Components having the same structure as those previously described with reference to FIG. 1 are explained with the same reference numbers.

The wafer-fixing jig 20 generally includes for example, a rubber film 22, a set table 23, and a porous plate 24. The outer frame 21 is a cylinder shaped member made from metal (ceramic and resin are also possible), and floor 25 is placed in the center (refer to FIG. 2B). The size of the outer frame 21 (diameter when seen from the top) is set to be slightly larger than the external shape of the wafer 1. The rubber film 22 is arranged on the upper part of the floor formed in the wafer-fixing jig 20.

The rubber film 22 is made elastic by injecting fluids (in this embodiment, air, but, other gases or fluids are also possible) inside. The rubber film 22 has a thickness of between 0.2 mm and 0.8 mm, and the use of materials such as butyl rubber, fluorinated rubber, and ethylene-propylene rubber is desirable considering the strength and the environment in which it is used.

Air is introduced from and exhausted to the inside of the rubber film 22 through a first air joint 26 provided in the floor 25. The bottom part of the rubber film 22 is attached in an air tight manner to the floor 25. Furthermore, a disk shaped set table 23 with the same diameter as that of the wafer 1 is arranged inside the rubber film 22.

On the under surface of the set table 23, four guide shafts 27 and a second air joint 28 are provided. Each guide shaft 27 and the second air joint 28 are movably journaled to the floor 25.

The guide shafts 27 and the second air joint 28 are constructed so as to pass through the floor 25, but cause no air leakage where the guide shafts and the air joint pass through thanks to sealing members arranged between the floor 25 and the guide shafts 27, as well as between the floor 25 and the air joint 28.

A porous plate 24 is arranged on the top surface of the set table 23. The porous plate 24 is connected to the second air joint 28 and enables suction or air introduction.

An air supply/exhaust device (not shown) is connected to the first air joint 26 and the second air joint 28. An elevating mechanism (not shown) for elevating the set table 23 is connected to the guide shafts 27.

Next, a method of manufacturing a semiconductor device using the constructed wafer-fixing jig 20 is explained.

The characteristics of the present invention can be found, for example, in the attachment step, in the back grind step, in the tape reapplication step, in the singularization step, and in the pick up step; and other manufacturing steps that refer to methods well known in the art. Thus, the following descriptions only concern each of the above steps, and descriptions of other well-known manufacturing steps are omitted.

Figure 3A:
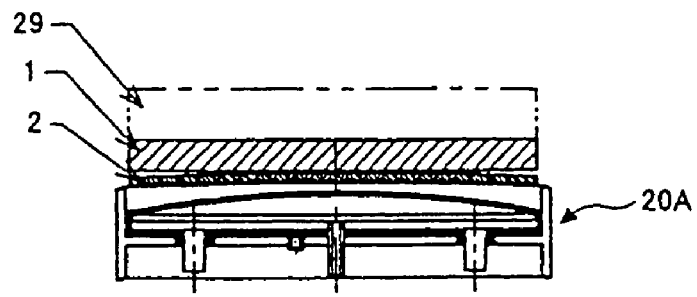
FIGS. 3A-3G are flow diagrams for explaining the method of manufacturing a semiconductor device according to the first embodiment of the present invention.
Figure 3B:
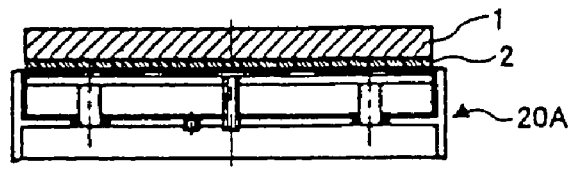
Figure 3C:
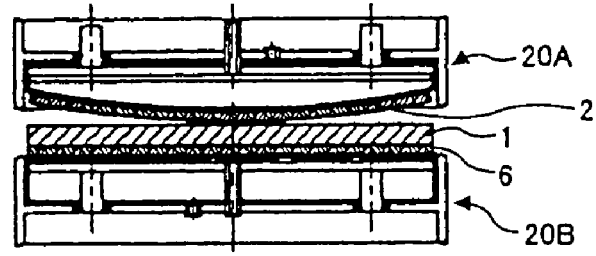

FIG. 3A through FIG. 3G show a method of manufacturing the semiconductor device according to the first embodiment. First, a protection tape 2 is attached to the wafer 1 by means of the wafer-fixing jig 20A, as shown in FIG. 3A. The protection tape 2 is also attached to the rubber film 22A of the wafer-fixing jig 20A. Although the wafer-fixing jig 20A is the same as the wafer-fixing jig 20 shown previously in FIG. 2, because two jigs are used in this embodiment, the letters "A" and "B" are used to represent each jig and to distinguish one from the other.

The method of attaching the protection tape 2 to the wafer 1 by means of the wafer-fixing jig 20 is explained with reference to FIG. 4A through FIG. 4D.

Figure 4A:
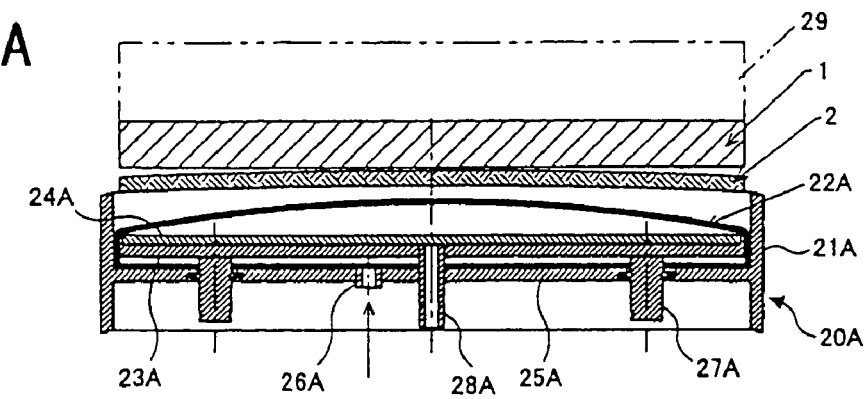
FIGS. 4A-4D are flow diagrams explaining in detail the method of manufacturing a semiconductor device according to a first embodiment of the present invention.

FIG. 4A shows a state before the protection tape 2 is attached to the wafer 1 (hereinafter referred to as an pre-attachment state). In the pre-attachment state, the wafer 1 is adsorbed and held by the wafer hand 29 with the circuit-forming surface side facing down, as shown in the figure. The previously explained wafer-fixing jig 20A is placed below the wafer 1. The protection tape 2 is provided between the wafer 1 and the wafer-fixing jig 20A, by a device not particularly shown.

The protection tape 2 is a so-called double-sided tape with adhesive materials applied on both sides. The adhesives have a property in which heating decreases their adhesive strength. Therefore, if the heating temperature of the protection tape 2 is in a relationship expressed as (under surface temperature) >(top surface temperature), the adhesive strength of the under surface will first decrease and then the adhesive strength of the top surface will decrease as the temperature rises.

Figure 4B:
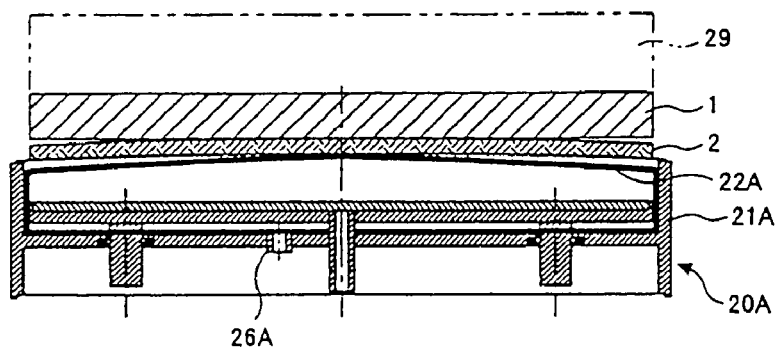
Figure 4C:
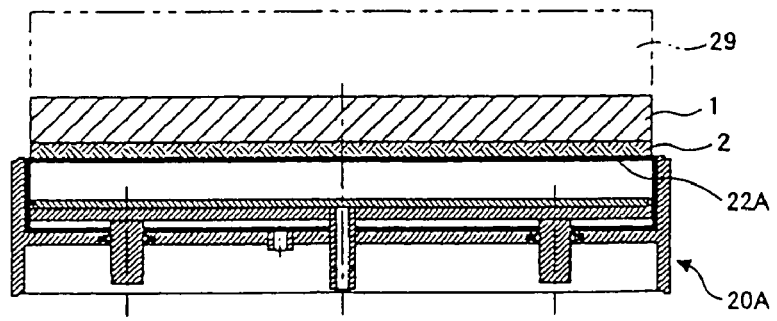
Figure 4D:
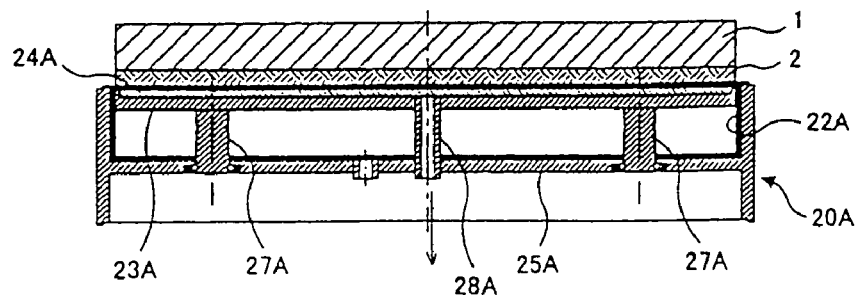
Figure 6A:
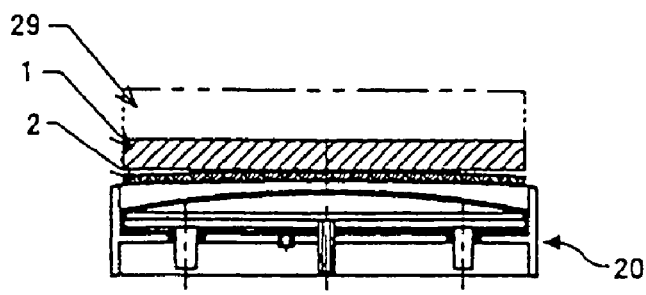
FIGS. 6A-6G are flow diagrams explaining in detail the method of manufacturing a semiconductor device according to a second embodiment of the present invention.
Figure 6B:
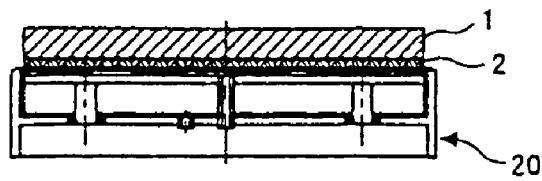
Figure 6C:
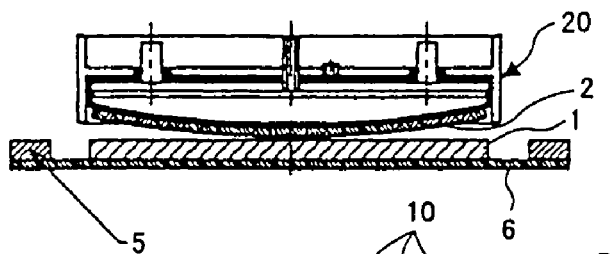
Figure 6D:
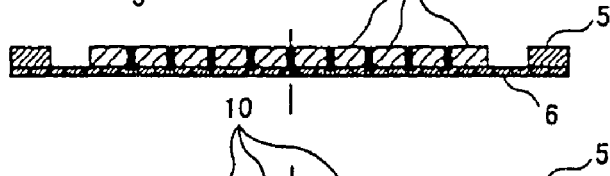
Figure 6E:
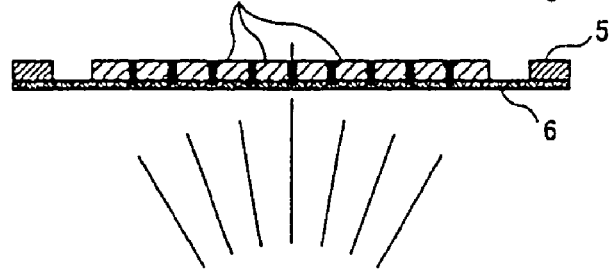
Figure 6F:
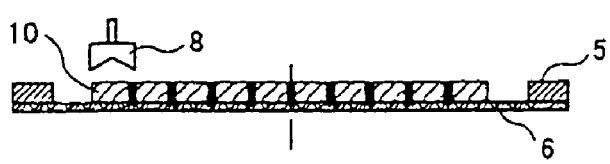
Figure 6G:
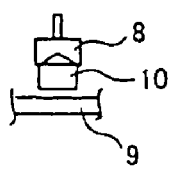

In the pre-attachment state, air is pressured to the inside of the rubber film 22A from the first air joint 26A provided in the floor 25, and the rubber film 22A expands and deforms outwardly from the center due to its property (refer to FIG. 4B). The deformation of rubber film 22A causes the protection tape 2 to be pushed toward the wafer 1.

As mentioned above, the adhesives are applied to both sides of the protection tape 2. For this reason, the protection tape 2 will be attached to the wafer 1 and at the same time to the rubber film 22A of the wafer-fixing jig 20A. This attachment is carried out ideally from the center toward the periphery so that there will be little chance of bubbles entering between the protection tape 2 and the wafer 1.

When the wafer 1 is completely sandwiched from the top and the bottom between the wafer hand 29 and the rubber film 22A (the state shown in FIG. 4C), the elevation mechanism is activated causing the set table 23A to rise, and be locked with the wafer 1 in a contacted manner through the rubber film 22A and the protection tape 2.

Next, an air supply/exhaust device is activated, performing the suction process through the second air joint 28A. Thus, a negative pressure is produced in the porous plate 24A and the rubber film 22A is adsorbed and is fixed to the porous plate 24A.

The attachment of the protection tape 2 to the wafer-fixing jig 20A is completed through these operations, and the wafer hand 29 is then removed from the wafer 1. Finally, the protection tape 2 is cut to substantially the same diameter as that of the wafer 1. Attaching the wafer 1 to the wafer-fixing jig 20A through the protection tape 2 can be easily carried out so that bubbles will not enter between them even if the attachment is not conducted under the vacuum environment.

Referring back to FIG. 3, the steps after the step of attaching the wafer to the jig are explained.

After the attachment step mentioned above is completed, the next step in which the wafer 1 is transported along with the wafer-fixing jig 20A to the back grind device (not shown) for thinning the back surface of the wafer is conducted. In the back grind device, the back surface of the wafer 1 is subjected to a grinding process. This process may be a mechanical process, a chemical process, or any other process.

The set table 23A is locked at its top position and the rubber film 22A is adsorbed by the porous plate 24A due to the negative pressure. Thus, because the rubber film 22 is fixed to the porous plate 24A, the wafer 1 attached to the rubber film 22 through the protection tape 2 is also securely fixed to the wafer-fixing jig 20A.

However, it is sometimes better to have a mechanism where a certain degree of vibration during the back grinding process is absorbed, depending on the thickness of the wafer 1 subjected to the back grinding process. The air pressure of about 0.01 Mpa to 0.05 Mpa is then provided to the inside of the rubber film 22A, lowering the set table 23A slightly. The rubber film 22A acts as an air suspension device. Since the wafer 1 will then be fabricated oil the jig with an air suspension function, the polishing quality will be more stable.

When the back grind step is completed, the wafer 1 is thinned and warped, but this warping is not significant since the wafer 1 is fixed to the wafer-fixing jig 20A by the protection tape 2. Furthermore, although the strength of the wafer 1 is reduced because it is thinner, the wafer 1 does not break since the wafer-fixing jig 20A acts as reinforcement to the wafer 1.

After the above back grind step is completed, the next step, which is the tape reapplication step of reapplying the tape for singularization, is conducted. The reapplication step is explained in detail with reference to FIG. 5.

In this embodiment, the wafer-fixing jig 20B is used in addition to the wafer-fixing jig 20A for conducting the reapplication step. In other words, in this embodiment, two wafer-fixing jigs 20A, 20B (both having the same construction) are used to conduct the tape reapplication step.

As shown in FIG. 5A, the wafer-fixing jig 20A with the wafer 1 attached, having completed the back grind step, is turned upside down and then placed on top of the wafer-fixing jig 20B. A heating process is then conducted on the protection tape 2 in a manner not shown in the figure, and the adhesive strength of the surface contacting the wafer 1 decreases due to the properties of the protection tape 2 used. Here, the adhesive strength of the surface on the side contacting the wafer-fixing jig 20A, which requires a higher heating temperature, is not yet decreased (the adhesive strength still remains the same).

On the other hand, the wafer-fixing jig 20B is placed below the wafer-fixing jig 20A provided as above. Furthermore, a dicing tape 6 to be applied to the back surface side of the wafer 1 is provided between the wafer-fixing jig 20A and the wafer-fixing jig 20B.

An adhesive, with the property in which heating decreases adhesive strength, is applied on both sides of the dicing tape 6. The heating temperature for decreasing the adhesive strength of the adhesive is set so that the heating temperature of the under surface (surface facing the rubber film 22B) is higher than the heating temperature of the top surface (surface facing the wafer 1).

When the wafer-fixing jig 20A with the wafer, and the wafer-fixing jig 20B are placed in a top and bottom position so as to be opposite one another and attached by the dicing tape 6, the wafer-fixing jig 20B in the lower position operates similar to that explained with reference to FIG. 4A through FIG. 4D.

Generally, introducing air from the first air joint causes the volume of the rubber film 22B to increase, and the dicing tape 6 is then attached to the back surface of the wafer 1 from the center outward. The dicing tape 6 is also attached to the rubber film 22B.

Thereafter, the set table 23B rises and the rubber film 22B is pressed against the wafer 1 through the dicing tape 6. Next, a negative pressure is applied to the second air joint 28B and the rubber film 22B is fixed to the porous plate 24A. After the above processes are completed, the wafer 1 is held between the wafer-fixing jig 20A and the wafer-fixing jig 20B, as shown in FIG. 5B.

Next, the set table 23A provided in the wafer-fixing jig 20A in an upper position is moved (upward direction in the figure) so as to be separated from the wafer 1, and at the same time the air within the rubber film 22A is exhausted through the first air joint 26A. As a result, the volume of the rubber film 22A is smaller (contracts) due to its own elastic restoring force.

With the contraction of rubber film 22A, the protection tape 2 is peeled from the boundary face of the wafer 1 having a decreased adhesive strength caused by the heating process, as described above. When peeling the protection tape 2 from the wafer 1, the operation performed will be the reverse of that performed during attachment due to the properties of the rubber film 22A, and thus peeling the protection tape 2 from the wafer 1 is carried out from the periphery towards the center in a direction which is easier to peel (refer to FIG. 5C).

Figure 3D:
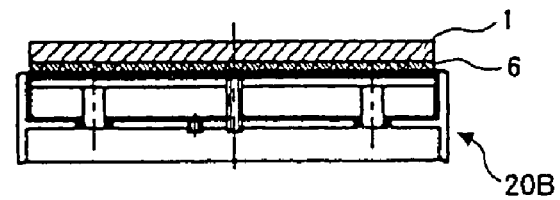

When the protection tape 2 is completely peeled from the wafer 1, the wafer-fixing jig 20A is removed. Afterwards, the dicing tape 6 applied to the wafer-fixing jig 20B in the lower position is cut to substantially the same diameter as that of the wafer 1, and the tape reapplication step is completed. FIG. 3D shows a state in which the tape reapplication step is completed.

Naturally, in order to peel the tape attached to the jig having a rigid body, the jig must be lifted up with the adhesive strength of the tape being zero, or must be slid laterally by performing a special process. However, both are technically very difficult.

Nevertheless, it is possible according to the present invention to carry out the reapplication process easily and securely by using the wafer-fixing jig 20A, 20B of the present embodiment, because the reapplication of the protection tape 2 and the dicing tape 6 are performed utilizing the deformation of the rubber film 22A, 22B when the volume increases and decreases. Furthermore, for the reasons mentioned above, when attaching each tape 2, 6 to the wafer 1 or to the rubber film 22A, 22B, it is possible to prevent bubbles from entering.

Referring back to FIG. 3 again, steps following the tape reapplication step are explained.

After the tape reapplication step is completed, the wafer 1 is transferred to a dicing device in a state shown in FIG. 3D, in other words, in a state in which the wafer 1 is fixed to the wafer-fixing jig 20B, and the singularization step for singularizing the wafer 1 into semiconductor elements 10 is conducted.

Figure 3E:
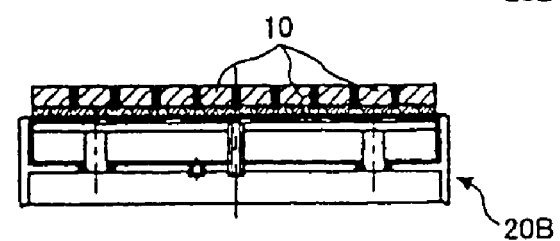

The wafer 1 is cut to semiconductor elements 10, but, as shown in FIG. 3E, each semiconductor element is still aligned for each of them are fixed onto the wafer-fixing jig 20B through dicing tape 6 even after the singularization step. In the singularization step, a method of dicing (cutting) the wafer 1 may be mechanical, optical or any other form of method.

Figure 3F:
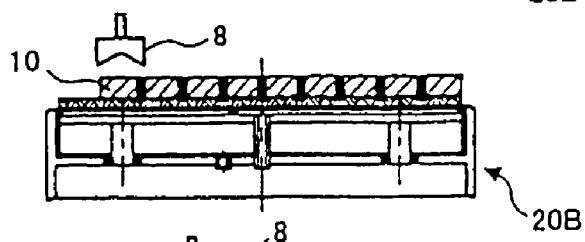
Figure 3G:
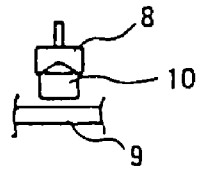

After the singularization step is completed, a pick up step for picking up the semiconductor elements 10 from the wafer-fixing jig 20B (dicing tape 6), and a die bonding step for mounting the semiconductor elements 10 to the mounting substrate 9 are conducted, as shown in FIG. 3F and FIG. 3G.

In the pick up step, the dicing tape 6 is subjected to a heating process using a heating means not shown, and the adhesive strength of the surface of the dicing tape 6 contacting each semiconductor element is decreased. Since the surface of the dicing tape 6 contacting the rubber film 22B (wafer-fixing jig 20B) is applied with adhesive consisting of a material whose adhesive strength decreases at a higher temperature, the adhesive strength on the rubber film 22B side does not decrease at this point of heating.

As the adhesive strength between the dicing tape 6 and the semiconductor elements 10 decrease, a collet 8 moves and adsorbs the semiconductor elements through vacuum, and picks up the elements from the dicing tape 6. Here, it is ensured that even thinned semiconductor elements 10 with a decreased strength can be securely picked up without damage because of the decreased adhesive strength.

The picked up semiconductor elements 10 are transferred to a predetermined position on, for example, the mounting substrate 9 and are die bonded to the mounting substrate 9. After the pick UP step and the die bonding step are conducted for all the semiconductor elements 10 attached to the dicing tape 6, the protection tape 2 and the dicing tape 6 are peeled from the rubber film 22A, 22B, respectively, by conducting a further heating process at a higher temperature. The wafer-fixing jigs 20A, 20B can be recycled.

As explained above, according to this embodiment, the warping of the thinned wafer 1 is not significant and the performance of each step is not degraded. Furthermore, although the wafer 1 has a decreased strength due to being thinned, the wafer-fixing jigs 20A, 20B to which the wafer 1 is attached reinforce the wafer and thus no breakage failure will occur. Furthermore, it is possible to carry out the step of reapplying the protection tape 2 with the dicing tape 6 without performing a special process by using the wafer-fixing jigs 20A, 20B.

Now, a second embodiment of the present invention according to the method of manufacturing a semiconductor device is explained.

FIG. 6 is a flow diagram of a method of manufacturing a semiconductor device according to a second embodiment. In this embodiment as well, each manufacturing step is performed using the wafer-fixing jig 20 shown in FIG. 2.

In FIG. 6, components the same as those shown in FIG. 3 through FIG. 5 have the same reference numbers and thus their explanations are omitted. Steps the same as those explained in the first embodiment are omitted to avoid redundancy of the explanation. This holds for each of the subsequent embodiments explained after the second embodiment.

In this embodiment, the attachment step and the back grind step are carried out in a similar manner as those explained in the first embodiment. This embodiment, however, is characterized in that in the tape reapplication step following the back grind step, a conventionally used frame 5 arranged with a dicing tape 6 is used as the wafer-fixing jig instead of the wafer-fixing jig 20.

In the structure of this embodiment, it is necessary to apply the wafer 1 to the dicing tape 6 arranged in the frame 5. Here, there is a possibility that bubbles may enter between the wafer 1 and the dicing tape 6, but although not as completely compared to the first embodiment, the entering of bubbles may be prevented by adopting an attachment method of pressing down with rollers, or an attachment method under a vacuum.

According to this embodiment, because there is no need for the dicing tape 6 to be attached to the wafer-fixing jig 20, a step of irradiating ultraviolet rays may be performed before the subsequently performed pick up step, and the flexible ultraviolet curing tape may be used as the dicing tape 6, thus reducing the manufacturing costs.

Next, a third embodiment according to the method of manufacturing the semiconductor device is explained.

FIG. 7A through FIG. 7I show flow diagrams of a method of manufacturing the semiconductor device according to a third embodiment. In this embodiment as well, each manufacturing step is performed using the wafer-fixing jig 20 shown in FIG. 2. In this figure, two manufacturing methods in which one flows as FIG. 7A.fwdarw.FIG. 7B.fwdarw.FIG. 7C.fwdarw.FIG. 7D.fwdarw.FIG. 7E.fwdarw.FIG. 7F.fwdarw.FIG. 7G (manufacturing method 1) and the other flows as FIG. 7A.fwdarw.FIG. 7B.fwdarw.FIG. 7C.fwdarw. FIG. 7H.fwdarw.FIG. 7I.fwdarw.FIG. 7G (manufacturing method 2) are shown in the same diagram for convenience.

In this embodiment, the attachment step and the back grind step are the same as those shown according to the first embodiment (refer to FIG. 3). However, this embodiment is characterized in that in the first embodiment, the tape reapplication step is conducted after the back grind step, whereas in this embodiment the singularization step is conducted after the back grind step.

In the manufacturing method 1, the singularization step is not necessarily performed after the tape reapplication step, and it is possible to arbitrarily change the order of the singularization step and the tape reapplication step. Thus, the degree of freedom in designing the steps is enhanced, and the equipment may be effectively operated. In the manufacturing method 1 of this embodiment, two wafer-fixing jigs 20A and 20B are used to perform the tape reapplication step, but as explained with reference to FIG. 6, it is also possible to use the dicing tape 6 arranged in the frame 5.

In the manufacturing step 2, it is possible to shift to the pick up step and the die bonding step immediately after completing the singularization step. In other words, according to the manufacturing method 2, it is possible to eliminate the tape reapplication step. Thus, it is possible to reduce the number of processes compared to the conventional art, and thus reduce the cost and shorten the process time, while facilitating the transportation of the thinned and warped wafer 1, and reinforcing the wafer 1 of decreased strength.

However, it is necessary to perform the die bonding step after the semiconductor elements 10 picked up by collets 8A, 8B, as shown in FIG. 7H, are turned upside down as shown in FIG. 7I, since it is necessary for the back surface of the semiconductor elements 10 to be placed opposite the mounting substrate 9 during the die bonding step. The time needed for turning upside down is extremely short compared to the time needed for the tape reapplication.

Next, a method of manufacturing a semiconductor device according to a fourth embodiment of the present invention is explained.

FIG. 8A through FIG. 8I show flow diagrams of the method of manufacturing a semiconductor device according to the fourth embodiment. In this figure as well, two manufacturing methods in which one flows as FIG. 8A.fwdarw.FIG. 8B.fwdarw.FIG. 8C.fwdarw.FIG. 8D.fwdarw.FIG. 8E.fwdarw. FIG. 8F.fwdarw.FIG. 8G (manufacturing method 1) and the other flows as FIG. 8A.fwdarw.FIG. 8B.fwdarw.FIG. 8C.fwdarw.FIG. 8H.fwdarw.FIG. 8I.fwdarw.FIG. 8G (manufacturing method 2) are shown in the same diagram for convenience.

This embodiment is characterized in that the singularization step is performed after the attachment step. Furthermore, this embodiment is constructed to perform the back grind step and the tape reapplication step after the singularization step is completed.

In the manufacturing method 1, the singularization step is not necessarily performed after the tape reapplication step, and it is possible to arbitrarily change the order of the back grind step, the singularization step, and the tape reapplication step. Thus, the degree of freedom in designing the steps is enhanced and the equipment may be effectively operated.

Although two wafer-fixing jigs 20A and 20B are used to perform the tape reapplication step in the manufacturing method 1 of this embodiment, it is also possible to use the dicing tape 6 arranged in the frame 5, as explained with reference to FIG. 6.

In the manufacturing step 2, it is possible to shift to the pick up step and the die bonding step immediately after completing the singularization step and the back grind step. In other words, the tape reapplication step may also be eliminated in the manufacturing method 2.

Therefore, the number of processes is reduced compared to the conventional art, and thus the cost is reduced and the process time shortened, while the transfer of thinned and warped wafer 1 is facilitated, and the wafer 1 with a decreased strength is reinforced. Furthermore, since the back grind process is carried out after the semiconductor elements 10 are singularized, the microscopic fragments of the edge portion of the semiconductor elements 10 formed during the singularization step may be removed by the back grind process, and thus the strength of the semiconductor elements 10 may be enhanced.

However, in this method, it is necessary to perform the die bonding step after the semiconductor elements 10 are turned upside down by collets 8A, 8B as shown in FIG. 8I. Nevertheless, the time needed for this turning is extremely short compared to the time needed for the tape reapplication as mentioned before.

Next, a wafer-fixing jig according to a second embodiment of the present invention is explained.

FIG. 9A through FIG. 9C show a wafer-fixing jig 30 according to the second embodiment. FIG. 9A is a top view of the wafer-fixing jig 30, FIG. 9B is a cross sectional view taken along line A-A of the wafer-fixing jig 30 shown in FIG. 9A, and FIG. 9C is the right side view of the wafer-fixing jig 30.

The wafer-fixing jig 30 is a jig used for attaching the protection tape 2 and the dicing tape 6 to the wafer 1, and for holding the wafer 1 applied with tape in a similar way as the above-described wafer-fixing jig 20 (refer to FIG. 2). The wafer-fixing jig 30 is generally constructed of an outer frame 31, a set of step rings 32, and a thrust bar 35 (shown in FIG. 10).

The outer frame 31 is a cylindrical member having a bottom, and made from metal (ceramic and resin are also possible). The diameter of the outer frame when viewed from the top is set to be somewhat larger than the diameter of the wafer 1. Furthermore, a set of step rings 32 (a set of ring shaped member) is placed within the outer frame 31. Furthermore, a pair of grooves 34 is formed on the sidewalls of the outer frame 31, from which grooves 34 the thrust bar 35 (operating member) is inserted as will be described later.

The set of step rings 32 includes plural ring shaped step rings 32a through 32i (only step ring 32i has a substantially circular shape). These step rings 32a through 32i are arranged concentrically within the outer frame 31. In other words, the diameters of the step rings are sequentially larger in the order of step ring 32h.fwdarw.step ring 32g.fwdarw . . . fwdarw.step ring 32a with the step ring 32i being the center.

Furthermore, the heights in the up and down direction (in the direction perpendicular to the wafer 1, up and down direction in FIG. 9B) of the step rings 32a through 32i are constructed so that the height gradually gets higher from step ring 32a in the outer most circumference towards step ring 32i in the inner most circumference. Thus, as shown in FIG. 9B, the height in the up and down direction of the step ring 32a in the outer most circumference has the minimum height H.sub.A, and the height in the up and down direction of the step ring 32i in the inner most circumference has the maximum height H.sub.I.

Furthermore, each step ring 32*a* through 32*i* is constructed so as to be individually movable in the up and down direction. However, a tension spring 33 (bias member) whose one end is connected to the bottom of the outer frame 31 is connected to each step ring 32*a* through 32*i*. Thus, in the non-operating state (in which thrust bar 35 is not inserted) shown in FIG. 9B, each step ring 32*a* through 32*i* is biased to the bottom of the outer frame 31 and is in a moved down position. In this state, the top surfaces of each step rings 32*a* through 32*i* are made substantially flat.

The thrust bar 35 is a rod shaped member, and is inserted inside the outer frame 31 from groove 34 as mentioned above. Furthermore, the tip of the thrust bar 35 has a tapered portion, as shown in FIG. 10.

Next, the operations of the above constructed wafer-fixing jig 30 are explained with reference to FIG. 10.

Figure 10A:
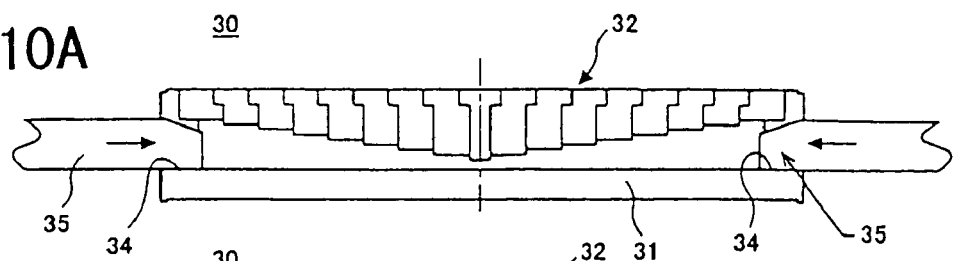
FIG. 10A-10E are diagrams showing the operations of the semiconductor substrate jig according to the second embodiment of the present invention.

FIG. 10A shows a non-operating state. In the non-operating state, the top surface of each step rings 32*a* through 32*i* of the set of step rings 32 is flat as mentioned above.

Figure 10B:
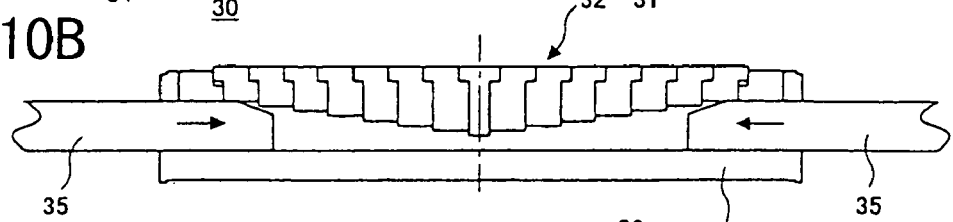

As the thrust bar 35 is inserted inside the outer frame 31 from the groove 34 as shown in FIG. 10B, the tapered portion at the tip of the thrust bar engages with the step rings 32*a* through step ring 32*i* one by one, biasing and moving up each step ring 32*a* through 32*i*.

Here, because there is a height difference between each step ring 32*a* through 32*i*, when a certain step ring is moved up, all the step rings located internal to that step ring will all move up. Generally, as shown in FIG. 10B, when the thrust bar 35 causes the step ring 32*a* in the outer most circumference to move up, the step rings 32*b* through 32*i* internal to the step ring 32*a* are simultaneously moved up while still maintaining a flat state.

Figure 10C:
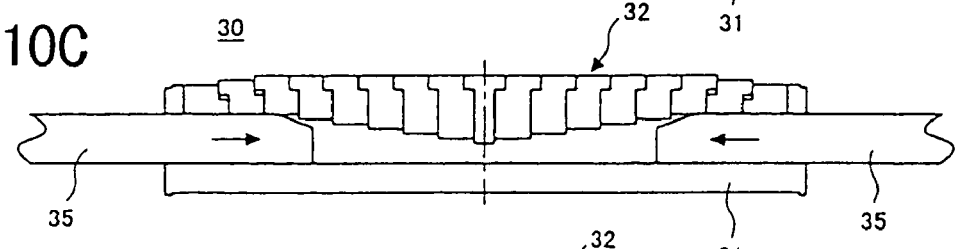
Figure 10D:
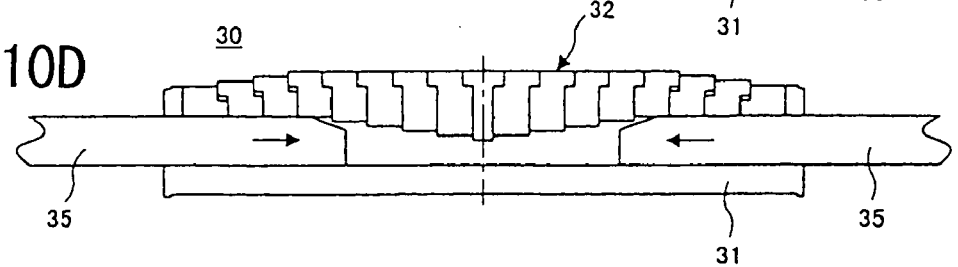

Subsequently, as shown in FIG. 10C, when the thrust bar 35 causes the step ring 32*b* located one ring internal to the step ring 32*a* to move up, the step rings 32*c* through 32*i* internal to the step ring 32*b* are simultaneously moved up while still maintaining a flat state. Furthermore, as shown in FIG. 10D, when the thrust bar 35 causes the step ring 32*c* located one ring internal to step ring 32*b* to move up, the step rings 32*d* through 32*i* internal to the step ring 32*c* are moved up simultaneously while still maintaining a flat state.

Figure 10E:
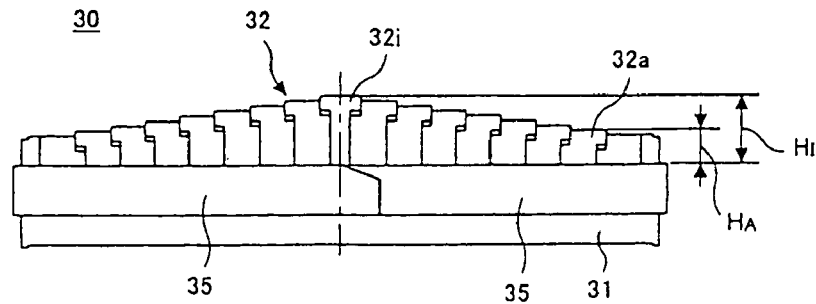

Similar operations are performed repeatedly a number of times as the thrust bar 35 is inserted, and when the bar 35 is completely inserted (hereinafter referred to this condition as the operation complete state), as shown in FIG. 10E, the set of step rings 32 forms a mountain like shape with the center step ring 32*i* being the highest point (height H.sub.I), and the step ring 32*a* being the lowest point (height H.sub.A). When the thrust bar 35 is retracted from the outer frame 31, each step ring 32*a* through 32*i* operate in a reverse manner as the operations stated above. The material of each step ring 32*a* through 32*i* consists of metal, ceramic, and resin, and the appropriate difference in height between each step ring 32*a* through 32*i* is about 0.5 to 2 mm, and the width is about 2 to 10 mm.

Next, a method of manufacturing a semiconductor device using the above constructed wafer-fixing jig 30 is explained.

The characteristics of this embodiment can be found in the attachment step, the back grind step, the tape reapplication step, the singularization step, and the pick up step, and other manufacturing steps use the well-known method. For this reason, the following explanations only concern each of the above-explained steps and explanations regarding other well-known manufacturing steps are omitted.

Figure 11A:
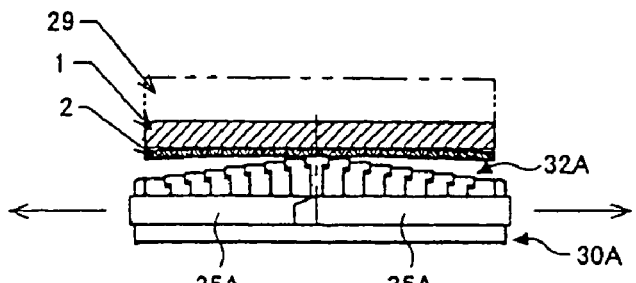
FIG. 11A-11H are flow diagrams explaining in detail the method of manufacturing a semiconductor device according to a fifth embodiment of the present invention.
Figure 11B:
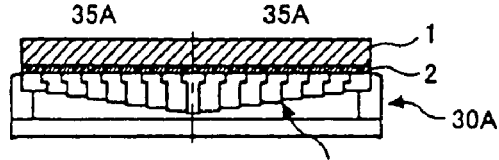
Figure 11C:
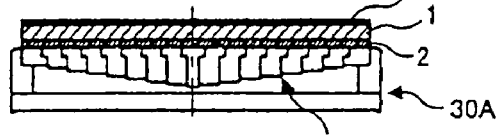
Figure 11D:
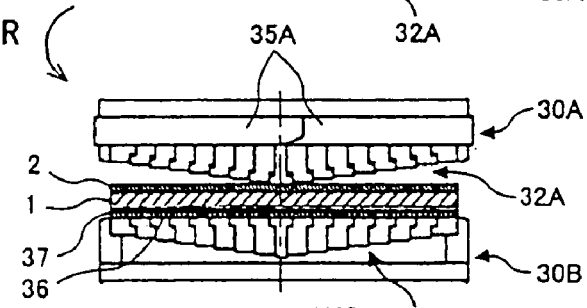
Figure 11E:
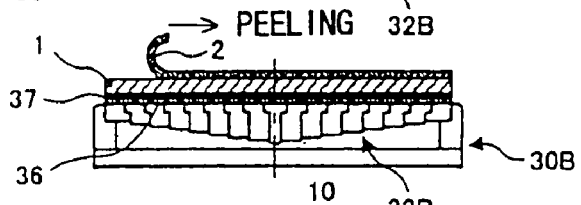
Figure 11F:
Figure 11G:
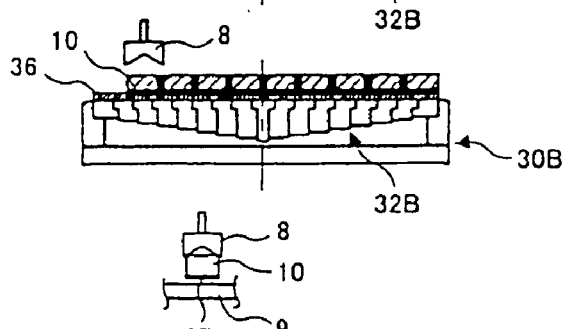
Figure 11H:
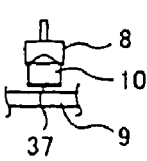

FIG. 11A thorough FIG. 11H show the method of manufacturing a semiconductor device according to a fifth embodiment. First, as shown in FIG. 11A, protection tape 2 is attached to the wafer 1 using the wafer-fixing jig 30A (step for attaching the wafer to the jig). Here, the protection tape 2 is also attached to the top surface of the set of step rings 32 of the wafer-fixing jig 30A. The wafer-fixing jig 30A is the same as the wafer-fixing jig 30 shown in FIG. 9, but because two jigs are used as will be stated later in this embodiment, the letters "A" and "B" are used to represent each construction and to distinguish one from the other.

To attach the protection tape 2 to the wafer 1, the wafer-fixing jig 30A must be in the operation complete state beforehand. The protection tape 2 is provided between the wafer 1 and the wafer-fixing jig 30A, and the wafer-fixing jig 30A is partially in contact with the wafer 1 through the protection tape 2.

In the state shown in FIG. 11A, only the center step ring 32*i* of the set of step rings 32 partially contacts the protection tape 2 because the wafer-fixing jig 30A is in an operation complete state as mentioned above. The adhesives, with the property that heating decreases their adhesive strength, are applied to both sides of the protection tape 2. In this embodiment, the temperature characteristics of the adhesives applied to the top and the under surfaces of the protection tape 2 is made the same.

Next, the thrust bar 35 is pulled in the direction shown by the arrows in FIG. 11A. Each of the step rings 32*a* through 32*i* of the wafer-fixing jig 30A gradually lowers from the center outward.

The wafer hand 29 holds the wafer 1, but synchronizes with the lowering action of each step ring 32*a* through 32*i*, and is constructed to drop an amount corresponding to the amount of the lowering stroke. Thus, the set of step rings 32 and the wafer 1 are always in a contacted state even while each of the step ring 32*a* through 32*i* is moving. Then, the thrust bar 35 is pulled further out, and when the bar is completely pulled out of the outer frame 31 (i.e. non-operating state), the top surface of the set of step rings 32 is flat.

The series of actions of the set of step rings 32 (step ring 32*a* through 32*i*) are actions in which step rings 32*a* through 32*i* gradually rise relatively from the center outward when seen from the wafer 1. With these actions of step ring 32*a* through 32*i*, the protection tape 2 is attached to the wafer 1 and to the top surface of the set of step rings 32.

Here, the protection tape 2 is attached a step at a time from the center of the wafer 1 outward because the step rings 32*a* through 32*i* sequentially rise relatively from the center outward. Thus, even if bubbles exist between the wafer 1 and the protection tape 2, the bubbles are pushed outward due the above action of the step rings 32*a* through 32*i*, and eventually no bubbles will exist between the wafer 1 and the protection tape 2. Thus even in the attachment process in this embodiment, the attachment is carried out ideally from the center outward so that there is little chance of bubbles entering between the protection tape 2 and the wafer 1.

When the protection tape 2 is attached to the wafer 1 and the top surfaces of the set of step rings 32, the wafer hand 29 is removed from the wafer 1, and the protection tape 2 is cut to substantially the same diameter as that of the wafer 1. Consequently, the attachment step is completed. As stated above, in this embodiment as well, the attachment between the wafer 1 and the protection tape 2 can be readily carried out so that no bubbles will enter even if the attachment is not conducted in a vacuum environment, by using the wafer-fixing jig 30A.

After the attachment step is completed, as shown in FIG. 11B, the back grind step is conducted. The back grind step is conducted to the wafer 1 fixed to the wafer-fixing jig 30A. The general method of the grinding process may be a mechanical process, a chemical process or any other processes.

When the back grind step is completed, the wafer 1 is thinned and warped, but because wafer 1 is fixed to the wafer-fixing jig 30A by the protection tape 2, the warping is not significant. The strength of the wafer 1 is decreased due to being thinned, but since wafer-fixing jig 30A serves to reinforce the wafer 1, wafer 1 will not break.

After the back grind step is completed, the die attach mount step shown in FIG. 11C is conducted. In the die attach mount step, a die attach film 37 is applied to the back surface of the wafer 1.

The die attach film is applied by means of a method of pushing down with for example, rollers not shown in the figure. The die attach film is, as will be stated later, a material for securing the semiconductor elements 10 and the mounting substrate 9 when mounting the semiconductor elements 10 to the mounting substrate 9.

When the die attach film 37 is applied to the back surface of the wafer 1, and in case it is necessary to change the temperature depending on the type of the die attach film 37, a heating mechanism is provided in the wafer-fixing jig 30A with which the die attach film 37 is heated.

After the die mount step is completed, the tape reapplication step is conducted. In this embodiment, the wafer-fixing jig 30B is used in addition to the wafer-fixing jig 30A to carry out the tape reapplication step. In other words, in this embodiment, the tape reapplication process is conducted using two wafer-fixing jigs 30A and 30B (both having the same construction).

As shown in FIG. 11D, the wafer-fixing jig 30A, with the wafer 1 having completed the back grind step attached, is turned upside down and placed on top of the wafer-fixing jig 30B. Heating process is conducted to the protection tape 2 in a manner not shown in the figure, and the adhesive strength of each of the adhesives applied to both sides of the protection tape 2 decreases.

In the wafer-fixing jig 30B in the lower position, a double-sided tape 36 is applied to the top surfaces of the set of step rings 32B. An adhesive whose adhesive strength is decreased by heat application is applied to both sides of the double-sided tape 36. The temperature characteristics of the adhesive are set so that the temperature for decreasing the adhesive strength of the adhesive applied to the top surface of the double-sided tape 36 (the surface opposite the wafer 1) is higher than the temperature for decreasing the adhesive strength of the adhesive applied to the under surface of the double-sided tape 36 (surface opposite the wafer-fixing jig 30B).

The wafer 1 fixed on the wafer-fixing jig 30A is attached to the double-sided tape 36. Here, each step ring 32a through 32i of the wafer-fixing jig 30B perform a similar action as those stated above, and thus the attachment of the double-sided tape 36 and the wafer 1 proceeds from the center outward. It is possible to prevent bubbles from entering between the double-sided tape 36 and the wafer 1 (generally, die attach film 37). After a series of processes are completed, the wafer 1 will be sandwiched between the wafer-fixing jig 30A and the wafer-fixing jig 30B.

Next, the wafer-fixing jig 30A in the upper position is operated and the thrust bar 35 is inserted to the inside of the outer film 31. With this action, the step rings 32a through 32i are gradually lowered from the outer circumference toward the center (lowering or dropping refers to the movement in a direction in which the step rings 32a through 32i separate from the wafer 1).

With the movement of each step ring 32a through 32i, the entire wafer-fixing jig 30A is raised (upward movement in FIG. 11).

Due to this action, the peeling at the boundary face between the wafer-fixing jig 30A and the protection tape 2 proceeds. This is a reverse action to the attachment action and peeling starts from the outer circumference toward the center in a direction easier to proceed. Eventually, the protection tape 2 is completely peeled from the wafer-fixing jig 30A.

As shown in FIG. 11E, the remainder of the protection tape 2 is peeled from the wafer 1. The peeling process of the protection 2 is easily performed because heating decreases the adhesive strength of the adhesives applied to the protection tape 2, and because the tape body of the protection tapes 2 is soft. After peeling, the double-sided tape 36 is cut to substantially the same diameter as that of the wafer 1 and finally the series of processes for the tape reapplication step is completed.

After the reapplication step is completed, the singularization step for singularizing the wafer 1 into semiconductor elements 10, the pick up step, and the die bonding step are performed, but besides the fact that wafer 1 (semiconductor elements 10) is fixed onto the wafer-fixing jig 30B, each step is not different from the steps in the manufacturing method related to the first embodiment with reference to FIG. 3, and thus their explanations are omitted. By peeling the double-sided tape 36 from the set of step rings 32, the wafer-fixing jig 30B can be recycled.

Next, a method of manufacturing the semiconductor device according to a sixth embodiment is shown.

FIG. 12A through FIG. 12H show flow diagrams of the method of manufacturing the semiconductor device according to the sixth embodiment. In this embodiment as well, each manufacturing step is conducted using the wafer-fixing jig 30 shown in FIG. 9.

In FIG. 12A through FIG. 12H, components same as those shown in FIG. 9 through FIG. 11 have the same reference numbers and thus their explanations are omitted to avoid redundancy.

In this embodiment, the attachment step and the back grind step are carried out in a similar way to those explained in the fifth embodiment. This embodiment, however, is characterized in that conventionally used frame 5 arranged with the dicing tape 6 is used as the wafer-fixing jig instead of the wafer-fixing jig 30.

In the structure of this embodiment, it is necessary to attach the wafer 1 to the dicing tape 6 arranged in the frame 5 in the tape reapplication step. Here, there is a possibility that bubbles enter between the wafer 1 and the dicing tape 6, but by adopting the method of pressing down with rollers or conducting the attachment process in a vacuum environment, it is possible, although not as completely as shown in the fifth embodiment, to prevent bubbles from entering.

In this embodiment, since there is no need for dicing tape 6 to be attached to the wafer-fixing jig 30, the ultraviolet irradiation step can be conducted before the subsequently performed pick up step, and the flexible ultraviolet curing tape used nowadays can be used as the dicing tape 6, thus reducing the manufacturing cost.

In the manufacturing method described in the fifth and the sixth embodiments, the wafer-fixing jig 30 shown in FIG. 9 it used. However, such manufacturing method of the fifth and the sixth embodiments shown in FIG. 11 and FIG. 12, respectively, can be performed without necessarily using the wafer-fixing jig 30.

Figure 13A:
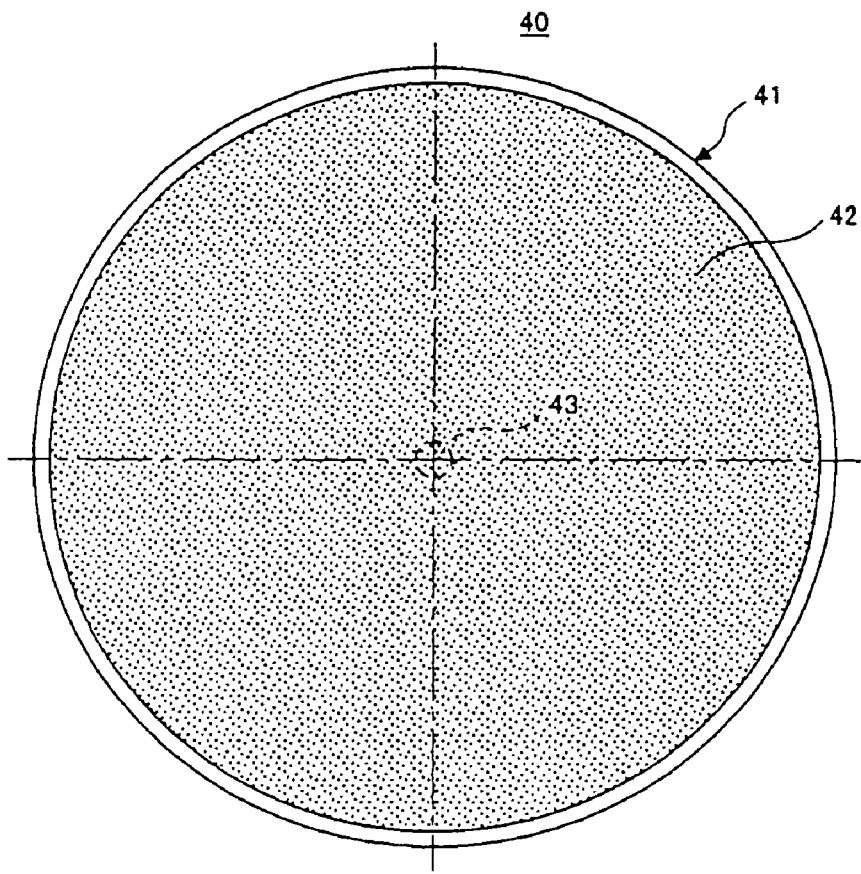
FIG. 13A is a top view showing semiconductor substrate jig according to the third embodiment of the present invention.
Figure 13B:
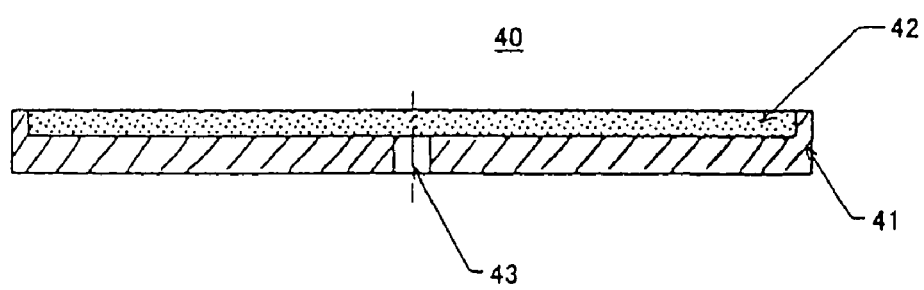
FIG. 13B is a cross sectional view showing the semiconductor substrate jig according to the third embodiment of the present invention.

FIGS. 13A and 13B show a wafer-fixing jig 40 according to the third embodiment, in which the wafer-fixing jig 40 is alternatively usable as the wafer-fixing jig 30.

The wafer-fixing jig 40 includes an outer frame 41 and a porous member 42. The outer frame 41 has a somewhat larger diameter than the diameter of the installed wafer 1. A vacuum pore 43 is formed in the center of the under part of the outer frame 41, and the vacuum pore 43 is connected to the vacuum device not shown. The outer frame 41 is composed of metal, ceramic, or resin.

The porous member 42 is arranged within the outer frame 41 and has substantially the same diameter as that of the installed wafer 1. The porous member 42 is connected to the vacuum pore 43 formed in the outer frame 41, and adsorbs the wafer 1 placed on the top thereof.

Through the use of the constructed wafer-fixing jig 40, it is possible to prevent bubbles from entering between the wafer-fixing jig 40 and each tape 2, 36 by suctioning while attaching the protection tape 2 and the double-sided tape 36 to the wafer-fixing jig 40. The tapes 2, 36 may be easily peeled from the wafer-fixing jig 40 by emitting air.

Next, a method of manufacturing the semiconductor device according to a seventh embodiment of the present invention is shown.

Figure 14A:
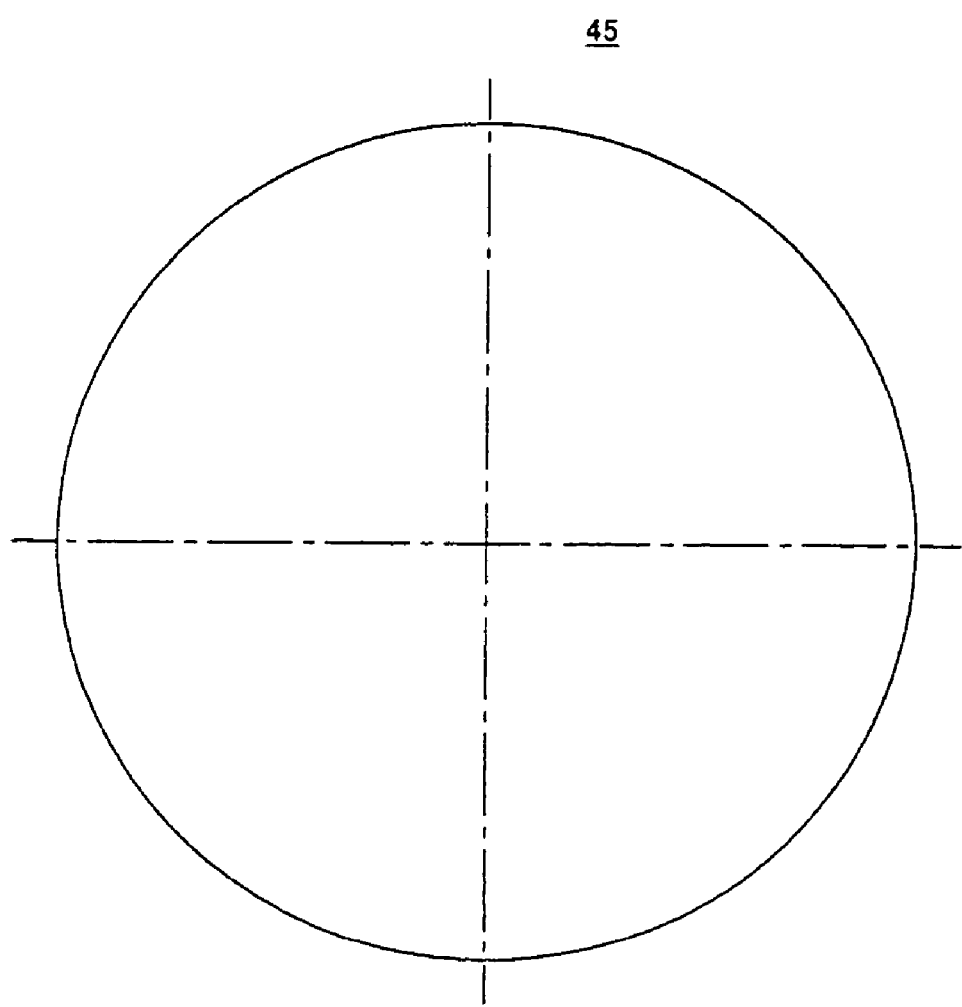
FIG. 14A is a top view showing a semiconductor substrate jig according to the fourth embodiment of the present invention.
Figure 14B:
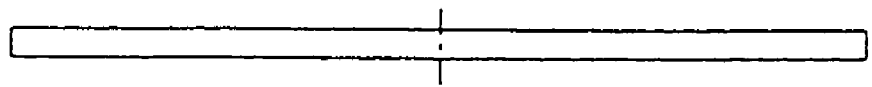
FIG. 14B is a cross sectional view showing the semiconductor substrate jig according to the fourth embodiment of the present invention.

FIG. 15A through FIG. 15H show flow diagrams showing the method of manufacturing the semiconductor device according to the seventh embodiment. In this embodiment, a disc 45 shown in FIG. 14 is used. The disc 45 is composed of a disc having substantially the same diameter as that of the wafer 1. The appropriate thickness of the disc is between 1 mm to 5 mm and the preferred material is quartz glass that transmits light.

Figure 15A:
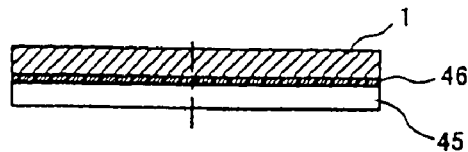
FIGS. 15A-15H are flow diagrams explaining in detail the method of manufacturing a semiconductor device according to a seventh embodiment of the present invention.

As shown in FIG. 15A, the wafer 1 is attached to the above constructed disc 45 using the double-sided tape 46. The double-sided tape 46 may be a flexible ultraviolet curing double-sided adhesive tape. The process of attaching the wafer 1 to the double-sided tape 46 can use, for example, the method of pushing down with rollers, or the method of applying the double-sided tape 46 to the wafer 1 under a vacuum environment. The double-sided tape 46 is attached to the disc 45 after it is attached to the wafer 1.

Figure 15B:
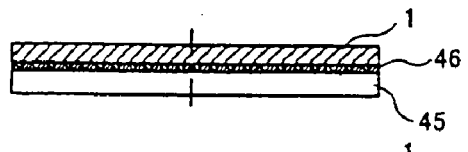
Figure 15C:
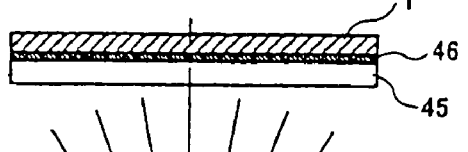

After the attachment step is completed, the wafer 1 is subjected to the back grind process while fixed on the disc 45 (back grind step) as shown in FIG. 15B. After the back grind step is completed, the first ultraviolet irradiation step is performed, as shown in FIG. 15C.

In the first irradiation step, the ultraviolet rays irradiate the adhesives applied to the double-sided tape 46 through the disc 45 having the property of light transmission. Thus, the adhesives applied to the double-sided tape 46 are cured and the adhesive strength is decreased.

Figure 15D:
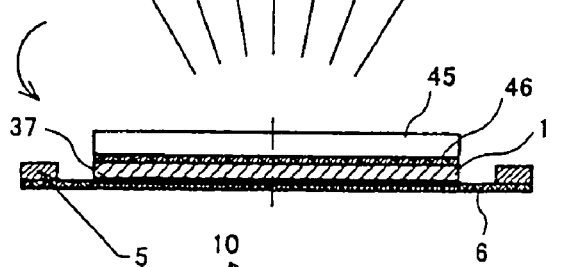
Figure 15E:
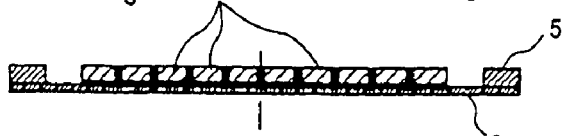
Figure 15F:
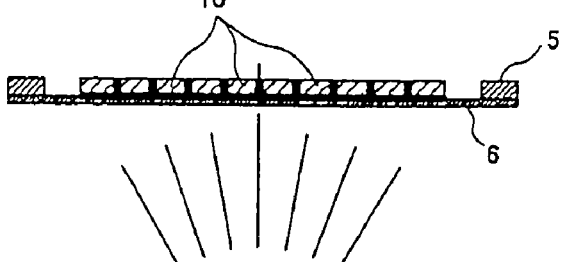
Figure 15G:
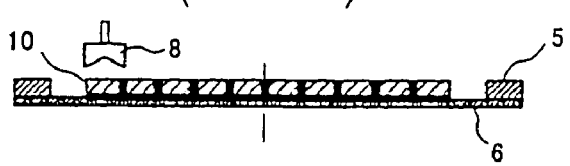
Figure 15H:
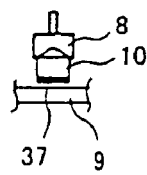

After the first ultraviolet irradiation step is completed, the tape reapplication step is conducted. In the tape reapplication step, the wafer 1 fixed to the disc 45 is turned upside down and the back surface of the wafer 1 is attached to the dicing tape 6 arranged in the frame 5, as shown in FIG. 15D. Here, the back surface of the wafer 1 may be attached to the dicing tape 6 after the die attach film 37 is mounted.

The ultraviolet curing adhesives may be applied to the dicing tape 6 beforehand through which the wafer 1 is attached to the dicing tape 6. Through the attachment method by pressing down with rollers and the attachment method of performing under vacuum environment, the wafer 1 and the dicing tape 6 are attached to one another without having bubbles between them.

After the tape reapplication step is completed, the disc 45 is removed and the singularization step is conducted. The wafer 1 is singularized into semiconductor elements 10. Thereafter, a second ultraviolet irradiation step is conducted, and ultraviolet rays are irradiated from the side of the back surface of the dicing tape 6 (from the under surface side in the figure). The adhesive strength of the ultraviolet curing type adhesive applied to the dicing tape 6 decreases. The pick up step and the die bonding step are conducted in the same manner as previously described, and the semiconductor elements 10 are mounted to the mounting substrate 9.

According to this embodiment, since disc 45 having the property of light transmission is used as the fixing jig for wafer 1, it is possible to perform ultraviolet irradiation from the under surface of the disc 45 in the subsequent steps. Thus, the flexible ultraviolet irradiation tape used conventionally nowadays can still be used and the running costs may be reduced.

Next, a method of manufacturing the semiconductor device according to an eighth embodiment is shown.

Figure 16A:
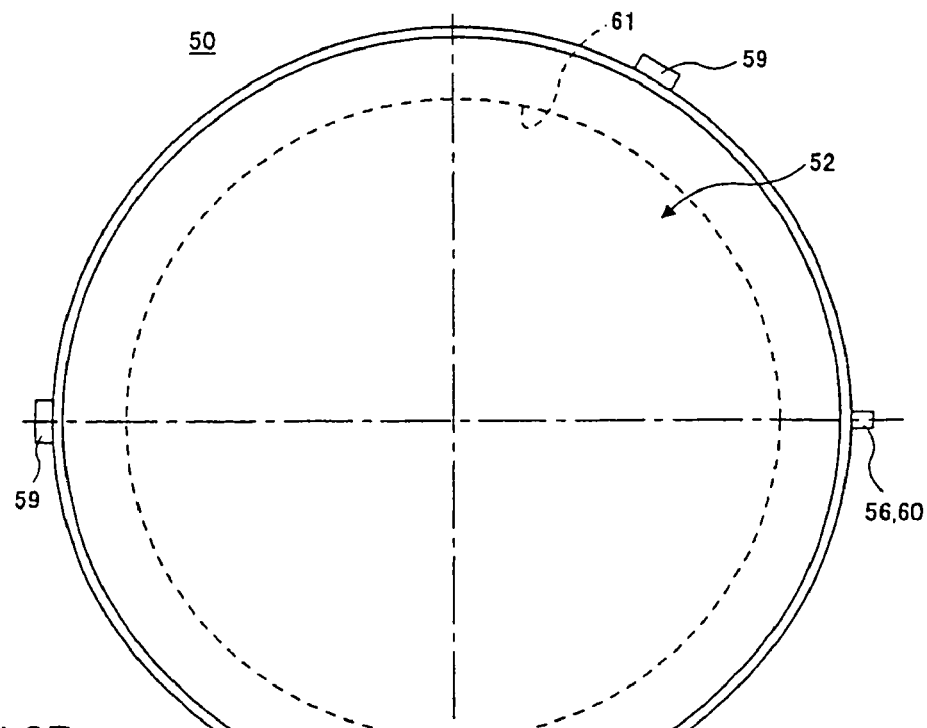
FIG. 16A is a top view showing a semiconductor substrate jig according to the fifth embodiment of the present invention.
Figure 16B:
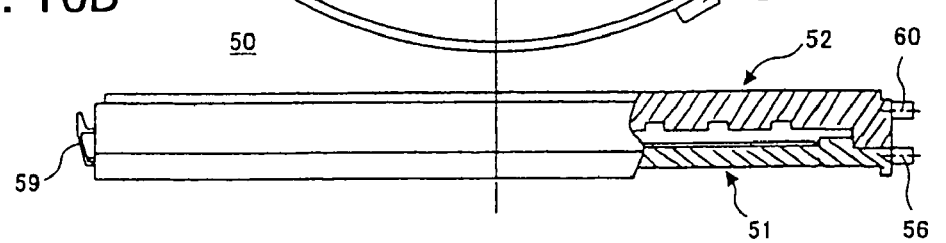
FIG. 16B is a cross sectional view showing the semiconductor substrate jig according to the fifth embodiment of the present invention.
Figure 16C:
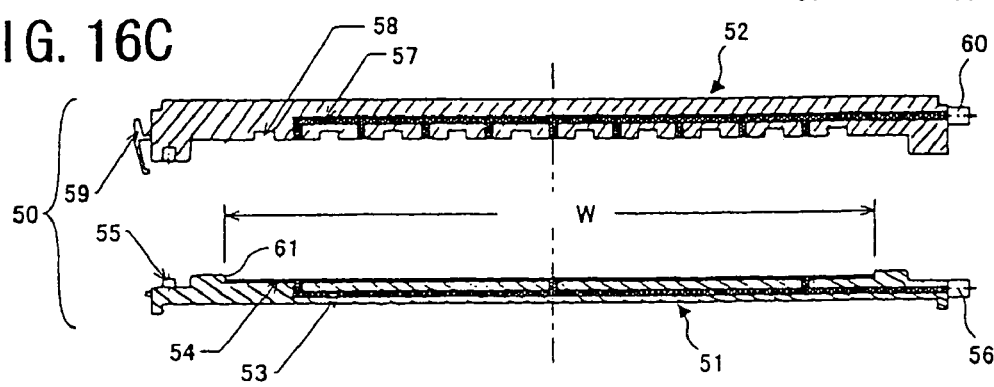
FIG. 16C is a cross sectional view showing the state in which the lower jig and the upper jig are separated according to the fifth embodiment of the semiconductor substrate jig of the present invention.

FIG. 16A through FIG. 16C show a wafer-fixing jig 50 used in the method of manufacturing the semiconductor device according to the eighth embodiment, and FIG. 17A through FIG. 17J show flow diagrams of the manufacturing method of the semiconductor device according to the eighth embodiment.

The wafer-fixing jig 50 is explained with reference to FIG. 16. The wafer-fixing jig 50 is generally composed of a lower jig 51 and an upper jig 52. These lower jig 51 and upper jig 52 are constructed so as to be combinable. The combined lower and upper jigs are secured with a hook 59 and thus the lower jig 51 and the upper jig 52 are unified.

The lower jig 51 is composed of metal (stainless) or ceramics, and a wafer installation part 61 for installing the wafer 1 (same diameter as the size of the diameter of the wafer W) is formed within the lower jig 51. A protection member 54 for protecting the circuit-forming surface is arranged on the wafer installation part 61. The protection member 54 consists of a porous protection member (rubber).

The lower vacuum hole 53 is formed in the lower jig 51. One end of the lower vacuum hole 53 is connected to the lower air joint formed on the side of the lower jig 51. A suction device not shown in the figure is connected to the lower air joint 56. The other end of the lower vacuum hole 53 branches out into plural branches and opens up towards the wafer installation part 61.

As the negative pressure is applied to the lower air joint 56 by driving the suction device, the wafer 1 installed to the wafer installation part 61 is adsorbed by the lower vacuum hole 53. The wafer 1 is constructed so as to be held by the lower jig 51. A detent pin 55 is a pin used as a positioning pin when the lower jig is being combined with the upper jig 52, and used to prevent rotation of each jigs 51 and 52 after having been combined.

Plural escape grooves for dicing 58 are formed in the upper jig 52. These grooves are formed so that the dicing saw does not damage the upper jig 52, since the wafer 1 is subjected to the dicing process while being held by the upper jig 52, as will be described later. An upper vacuum hole 57 is provided in the upper jig 52.

One end of the upper vacuum hole 57 is connected to an upper air joint 60 formed on the side of the upper jig 52. A suction device not shown in the figure is connected to the upper air joint 60. The other end of the upper vacuum hole 57 branches into several branches and opens down towards the installation position of the wafer 1 (opens towards a position between the dicing escape grooves 58).

As the negative pressure is applied to the upper air joint 60 by driving the suction device, the wafer 1 installed to the upper jig 52 is adsorbed by the upper vacuum hole 57. Wafer 1 is constructed so as to be held by the upper jig 52. Here, the lower air joint 56 and the upper air joint 60 are connected to independent suction device, and thus, the lower vacuum hole 53 and the upper vacuum hole 57 can independently carry out the suction process to the wafer 1.

Next, a method of manufacturing a semiconductor device using the constructed wafer-fixing jig 50 is explained with reference to FIG. 17.

Figure 17A:
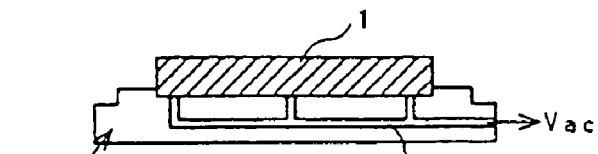
FIG. 17A-17J are flow diagrams explaining in detail the method of manufacturing a semiconductor device according to the eighth embodiment of the present invention.

In this embodiment, the wafer 1 is installed to the lower jig 51 so that the back surface of the wafer 1 is facing up, and at the same time, the negative pressure is applied to the lower vacuum hole 53 and the wafer 1 is held by the lower jig 51, as shown in FIG. 17A. Here, the protection member 54 is applied to where the circuit-forming surface of the wafer 1 contacts the lower jig 51, and thus circuit-forming surface is not damaged through suction.

Figure 17B:
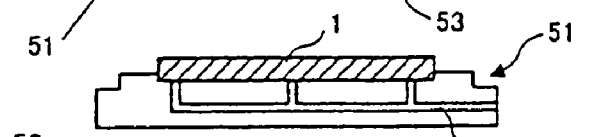

As shown in FIG. 17B, the back surface of the wafer 1 is subjected to the back grind step while being held by the lower jig 51. The back grind process may be a mechanical process, a chemical process or any other processes. At this point, the wafer 1 may be warped but this warping is not significant since it is suctioned by the lower jig 51.

Figure 17C:
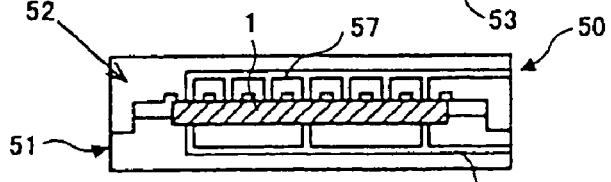

As shown in FIG. 17C, the lower jig 51 and the upper jig 52 are combined, and the wafer 1 is sandwiched from the top and the bottom. Here, the wafer 1 is installed inside the wafer-fixing jig 50, and held by each jigs 51, 52, and thus the suction process may be turned off. If the suction process is turned on, the wafer 1 may be more securely held and the warping may be more reliably prevented.

Figure 17D:
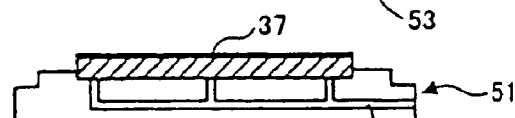
Figure 17E:
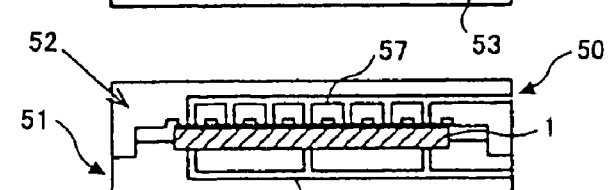

The wafer 1 is pulled out of the back grind device while being sandwiched by each jigs 51, 52 (in a state installed inside the wafer-fixing jig 50), then proceeds to the die attach film 37 application step. In this step, as the upper jig 52 is removed from the lower jig 51, the die attach film 37 is applied to the back surface of the wafer 1 using rollers not shown, as shown in FIG. 17D. If it is necessary to apply heat depending on the type of the die attach film 37, heating mechanism may be provided on the table at the side of the device for setting the lower jig 51 (die attach mount device).

After the die attach mount process is completed, the upper jig 52 is combined with the lower jig 51 again from the top and is in a state to be transported. The wafer 1 is transported to the dicing device in this state and is installed to the table inside the dicing device.

Figure 17F:
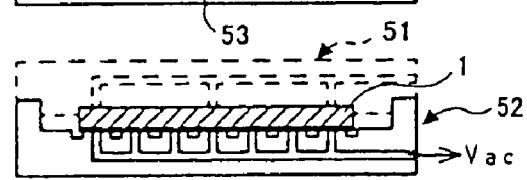

As shown in FIG. 17F, the wafer-fixing jig 50 is turned upside down and set on the table inside the dicing device so that the circuit-forming surface of the wafer 1 is facing upward. The suction process of the upper jig 52 is turned on, and the wafer 1 is held by the upper jig 52. When the wafer 1 is securely held by the upper jig 52, the lower jig 51 is removed from the upper jig 52.

Figure 17G:
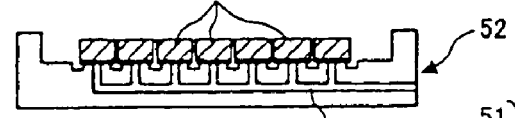

The wafer 1 is subjected to the dicing process in this state, as shown in FIG. 17G. The wafer 1 is cut to semiconductor elements 10. Upon dicing, the wafer 1 is generally cut to pieces using a dicing saw, but because dicing escape grooves 58 are formed in a position corresponding to the dicing position of the upper jig 52, as stated above, the upper jig 52 will not be damaged by the dicing saw. Furthermore, since the openings of the upper vacuum hole 57 are also provided opposite the semiconductor elements 10, the semiconductor elements 10 are securely held by the upper jig 52 even if they are cut to pieces.

Figure 17H:
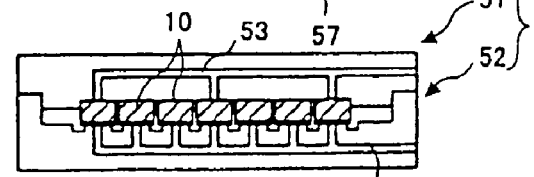

As shown in FIG. 17H, the lower jig 51 and the upper jig 52 are again combined and the wafer 1 is transferred to the next step, the die bonder, and is installed. As the wafer-fixing jig 50 is installed on the table of the die bonder, the negative pressure is applied to the upper vacuum hole 57 of the upper jig 52, and each of the semiconductor elements 10 is held by the upper jig 52. After the semiconductor elements 10 are securely held by the upper jig 52, the lower jig 51 is removed from the upper jig 52.

Figure 17I:
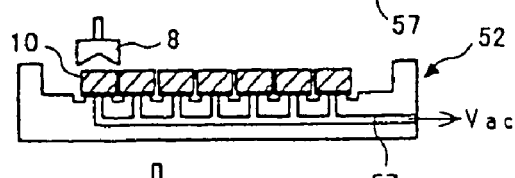
Figure 17J:
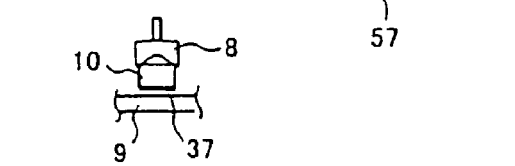

The pick up/bonding process is carried out to semiconductor element 10 individually in the die bonder, as shown in FIG. 17I and FIG. 17J. When the semiconductor elements 10 are picked up, the suction of the upper jig 52 is turned off and only the suction of the collet 8 is turned on.

In this embodiment, since there is no need for peeling the semiconductor element 10 from the tape, a special treatment of pushing up the semiconductor from the under surface with a needle is unnecessary. Thus, it is possible to have zero damage to the thinned semiconductor element 10 caused by the needle, and the damage of the semiconductor element 10 is prevented.

In this embodiment, as stated above, when wafer 1 is subjected to the processes in each step, the wafer 1 is held either by the lower jig 51 or the upper jig 52, and when being transported between each step, the wafer 1 is sandwiched between the lower jig 51 and the upper jig 52. Thus even with the thinned wafer 1, warping is not significant and performance will improve. Furthermore, damage failure caused by transportation will not arise.

The wafer-fixing jigs 20, 30, 40, and 50 used in each of the above manufacturing steps are all stackable one on top of the other, and the conventionally used dedicated carrier is no longer necessary when transporting between steps. Thus, not only are the costs needed for the indirect tools reduced, but also there will be no damage when storing and taking out the jigs. By adding barcodes to the wafer-fixing jigs 20, 30, 40, and 50, it is possible to manage information about the wafer 1.

According to the present invention, various advantages described below may be achieved.

According to one feature of the present invention, since the semiconductor substrate is fixed to the semiconductor substrate jig without warps occurring in the semiconductor substrate, the singularization step of the semiconductor substrate may be carried out smoothly.

Further, according to another feature of the present invention, since the semiconductor substrate is fixed to the semiconductor substrate jig without warps occurring in the semiconductor substrate, the back grinding step of the semiconductor substrate may be carried out smoothly.

According to one feature of the present invention, it is possible to prevent bubbles from remaining between the semiconductor substrate and the film, and thus the steps that follow can be conducted smoothly and at the same time damage of the semiconductor substrate due to the entering of bubbles may be prevented.

According to another feature of the present invention, it is possible to prevent bubbles from remaining between the semiconductor substrate and the first adhesive tape, and because the semiconductor substrate can be securely held by the semiconductor substrate jig in the back grind step, the back grind step can be conducted smoothly.

According to another feature of the present invention, after completing the back grind step, the tape reapplication step may be conducted before or after the sigularization step. Thus, the degree of freedom in designing steps of semiconductor manufacturing is enhanced.

According to another feature of the present invention, it is possible to prevent damage of the semiconductor substrate since the application step does not exist, and at the same time there is little chance of bubbles entering between the semiconductor substrate and the adhesive tape during reapplication.

According to another feature of the present invention, the back grind step can be conducted after the singularization step is completed. With this sequence, fragments caused at the edge portion of the semiconductor element in the singularization step can be removed in the back grind step. Thus, the strength of the semiconductor element is increased.

According to another feature of the present invention, it is possible to prevent bubbles from remaining between the semiconductor substrate and the film because the annular member moves individually, gradually pressing the film to the semiconductor substrate from the center outward. Therefore, the steps that follow can be conducted smoothly and damage to the semiconductor substrate due to the entering of bubbles may be prevented.

According to another feature of the present invention, it is possible to prevent bubbles from remaining between the semiconductor substrate and the first adhesive tape, and the state in which the semiconductor substrate is securely held by the semiconductor substrate jig is maintained in the back grind step. Thus, the back grind step can be conducted smoothly.

According to another feature of the present invention, ultraviolet rays can be irradiated through the semiconductor substrate jig to the adhesive having the property of ultraviolet curing, and the widely used ultraviolet curing type adhesives are used in the semiconductor manufacturing, thus the manufacturing cost of the semiconductor element are reduced.

According to another feature of the present invention, even with a thinned semiconductor substrate, the warping of the semiconductor substrate can be reliably prevented since the semiconductor substrate is held by either the first jig or the second jig.

According to another feature of the present invention, the semiconductor substrate jig according to the present invention is used, and thus the warping of the semiconductor is prevented when transporting the semiconductor substrate between the first jig and the second jig, and therefore, the breakage of the semiconductor substrate can be prevented thus enabling the subsequent semiconductor manufacturing steps to be smoothly conducted.

While the preferred embodiments of the present invention has been described, it is to be understood that the present invention is not limited to these embodiments, and variations and modifications may be made without departing from the scope of the present invention.

What is claimed is:

1. A semiconductor substrate jig comprising: a first jig having a wafer installation part with a protection member arranged thereon, the wafer installation part having a diameter the size of the wafer installed thereon, and a first suction mechanism sucking said semiconductor substrate; and a second jig having dicing grooves formed therein and a second suction mechanism sucking said semiconductor substrate, said second suction mechanism having a plurality of branches each of which opens towards a position between the dicing grooves, said first and second jigs being removably constructed and independently sucking said semiconductor substrate.

* * * * *